US012787892B2

(12) United States Patent
Jeong et al.

(10) Patent No.: US 12,787,892 B2
(45) Date of Patent: Nov. 3, 2026

(54) DISPLAY APPARATUS

(71) Applicant: SAMSUNG ELECTRONICS CO., LTD., Suwon-si (KR)

(72) Inventors: Dooho Jeong, Suwon-si (KR); Taehun Kim, Suwon-si (KR); Hanul Yoo, Suwon-si (KR); Taesung Jang, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 230 days.

(21) Appl. No.: 18/677,353

(22) Filed: May 29, 2024

(65) Prior Publication Data

US 2025/0022867 A1 Jan. 16, 2025

(30) Foreign Application Priority Data

Jul. 14, 2023 (KR) ........................ 10-2023-0091946
Jul. 31, 2023 (KR) ........................ 10-2023-0099935

(51) Int. Cl.

*H10W 90/00* (2026.01)
*H10H 29/14* (2025.01)
*H10W 72/20* (2026.01)

(52) U.S. Cl.

CPC .......... *H10W 90/00* (2026.01); *H10H 29/142* (2025.01); *H10W 72/242* (2026.01); *H10W 72/252* (2026.01); *H10W 90/722* (2026.01)

(58) Field of Classification Search

CPC ............................ H10W 90/00; H10H 29/142
See application file for complete search history.

(56) References Cited

U.S. PATENT DOCUMENTS

| | | | |
|---|---|---|---|
| 6,372,608 | B1 | 4/2002 | Shimoda et al. |
| 6,645,830 | B2 | 11/2003 | Shimoda et al. |
| RE38,466 | E | 3/2004 | Inoue et al. |
| 6,818,465 | B2 | 11/2004 | Biwa et al. |
| 6,818,530 | B2 | 11/2004 | Shimoda et al. |
| 6,858,081 | B2 | 2/2005 | Biwa et al. |
| 6,967,353 | B2 | 11/2005 | Suzuki et al. |
| 7,002,182 | B2 | 2/2006 | Okuyama et al. |
| 7,084,420 | B2 | 8/2006 | Kim et al. |
| 7,087,932 | B2 | 8/2006 | Okuyama et al. |
| 7,154,124 | B2 | 12/2006 | Han et al. |
| 7,208,725 | B2 | 4/2007 | Sherrer et al. |
| 7,288,758 | B2 | 10/2007 | Sherrer et al. |

(Continued)

FOREIGN PATENT DOCUMENTS

CN 105103093 A 11/2015

*Primary Examiner* — Suberr L Chi

(74) *Attorney, Agent, or Firm* — Wolf, Greenfield & Sacks, P.C.

(57) ABSTRACT

A display apparatus includes a circuit board including driving circuits; and a pixel array on the circuit board and including a plurality of pixels, wherein the pixel array includes LED cells having a pillar shape and including first and second conductivity-type semiconductor layers and an active layer, wherein a width thereof is 100 μm or less, and a height thereof is greater than the width; a transparent electrode on lower surfaces of the LED cells and including a cone or pyramid-shaped inclined portion; a passivation layer disposed on side surfaces of the LED cells and extending from a side surface of the LED cell to a side surface of the inclined portion of the transparent electrode.

20 Claims, 25 Drawing Sheets

(56) References Cited

U.S. PATENT DOCUMENTS

| | | | |
|---|---|---|---|
| 7,319,044 B2 | 1/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,379,283 B2 | 6/2016 | Cha et al. | |
| 9,559,260 B2 | 1/2017 | Lee et al. | |
| 11,050,004 B2 | 6/2021 | Liu et al. | |
| 11,411,139 B2 | 8/2022 | Xu et al. | |
| 2002/0016075 A1 | 2/2002 | Peng et al. | |
| 2021/0242369 A1 | 8/2021 | Choi et al. | |
| 2021/0366981 A1* | 11/2021 | Yeon | H10H 20/018 |
| 2022/0140183 A1 | 5/2022 | Han et al. | |
| 2023/0037888 A1* | 2/2023 | Yeon | H10H 20/8316 |

* cited by examiner

DISPLAY APPARATUS

CROSS-REFERENCE TO RELATED APPLICATION(S)

This application claims benefit of priority to Korean Patent Application Nos. 10-2023-0091946 and 10-2023-0099935 filed on Jul. 14, 2023, and Jul. 31, 2023, in the Korean Intellectual Property Office, the disclosure of which is incorporated herein by reference in its entirety.

BACKGROUND

The present disclosure relates to a display apparatus having an LED.

Semiconductor light emitting diodes (LED) are used as light sources for various electronic products as well as light sources for lighting devices. Specifically, LEDs are widely used as light sources for various display apparatuses such as televisions, mobile phones, personal computers (PC), laptop PCs, and personal digital assistants (PDA).

An existing display apparatus includes a display panel comprised of a liquid crystal display (LCD), and a backlight, but have recently been developed in a form in which the backlight is not separately required, using the LED as a pixel. Such a display apparatus can not only be miniaturized, but can also implement a high-brightness display apparatus having light efficiency superior to an LCD.

SUMMARY

An aspect of the present disclosure is to provide a high-resolution, high-efficiency display apparatus that may be manufactured using a simplified process.

According to an aspect of the present disclosure, a display apparatus may include: a circuit board including driving circuits and first bonding electrodes; and a pixel array on the circuit board, the pixel array including LED cells forming a plurality of pixels, and second bonding electrodes bonded to the first bonding electrodes. Each of the LED cells may have a width of 100 μm or less and includes a first conductivity-type semiconductor layer, an active layer, and a second conductivity-type semiconductor layer sequentially stacked. The pixel array may include a wavelength converter on an upper surface of each of the LED cells; an upper semiconductor layer on the LED cells and having a partition structure extending around a side surface of each wavelength converter and that separates the wavelength converters from each other. A transparent electrode is on a lower surface of each of the LED cells, and each transparent electrode includes a cone or pyramid-shaped inclined portion, wherein an inclination of a surface of the inclined portion is 40° to 70°. A passivation layer covers a side surface of each of the LED cells. A first reflective electrode is on the side surface of each of the LED cells and is spaced apart from each of the LED cells by the passivation layer, wherein the first reflective electrode extends to a region between the LED cells, and is connected to the first conductivity-type semiconductor layer in the region between the LED cells. A second reflective electrode is on the lower surface of each of the LED cells and is connected to the second conductivity-type semiconductor layer of each of the LED cells. A common electrode is on at least one side of the LED cells and is connected to the first reflective electrode. A pad electrode is external to the common electrode and is electrically connected to the driving circuits.

According to another aspect of the present disclosure, a display apparatus may include a circuit board including driving circuits; and a pixel array on the circuit board and including a plurality of pixels. The pixel array may include a plurality of LED cells, each having a pillar shape and including a first conductivity-type semiconductor layer, an active layer, and a second conductivity-type semiconductor layer that are sequentially stacked. A width of each of the plurality of LED cells is 100 μm or less, and a height of each of the plurality of LED cells is greater than the width. A transparent electrode is on a lower surface of each of the plurality of LED cells and includes a cone or pyramid-shaped inclined portion. A passivation layer is on a side surface of each of the plurality of LED cells and extends to a side surface of the inclined portion of the transparent electrode. A first electrode is connected to each of the first conductivity-type semiconductor layers; and a second electrode is on the lower surface of each of the plurality of LED cells and is connected to each of the second conductivity-type semiconductor layers.

A display apparatus includes a circuit board and a pixel array on the circuit board. The pixel array includes a plurality of LED cells, a plurality of transparent electrodes, a passivation layer, and first and second electrodes. Each of the plurality of LED cells has a pillar shape and includes a first conductivity-type semiconductor layer, an active layer, and a second conductivity-type semiconductor layer sequentially stacked. A height of each of the plurality of LED cells is greater than a width of each of the plurality of LED cells. Each transparent electrode covers an entire lower surface of a respective one of the plurality of LED cells, and each of the plurality of transparent electrodes includes a cone or pyramid-shaped inclined portion. The passivation layer is on a side surface of each of the plurality of LED cells and extends to a surface of the inclined portion of each of the plurality of transparent electrodes. The first electrode is connected to the first conductivity-type semiconductor layer of each of the plurality of LED cells, and the second electrode is connected to the second conductivity-type semiconductor layer of each of the plurality of LED cells through a respective one of the plurality of transparent electrodes.

According to example embodiments of the present disclosure, a high-efficiency display apparatus manufactured by a simplified process is provided.

Advantages and effects of the present application are not limited to the foregoing content and may be more easily understood in the process of describing a specific example embodiment of the present disclosure.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described with reference to the accompanying drawings.

Unless particularly described, in the present specification, it may be understood that the expressions such as "on," "above," "upper," "below", "beneath," "lower," and "side," merely indicated based on drawings, and may actually vary depending on the direction in which the components are disposed.

Figure 1:
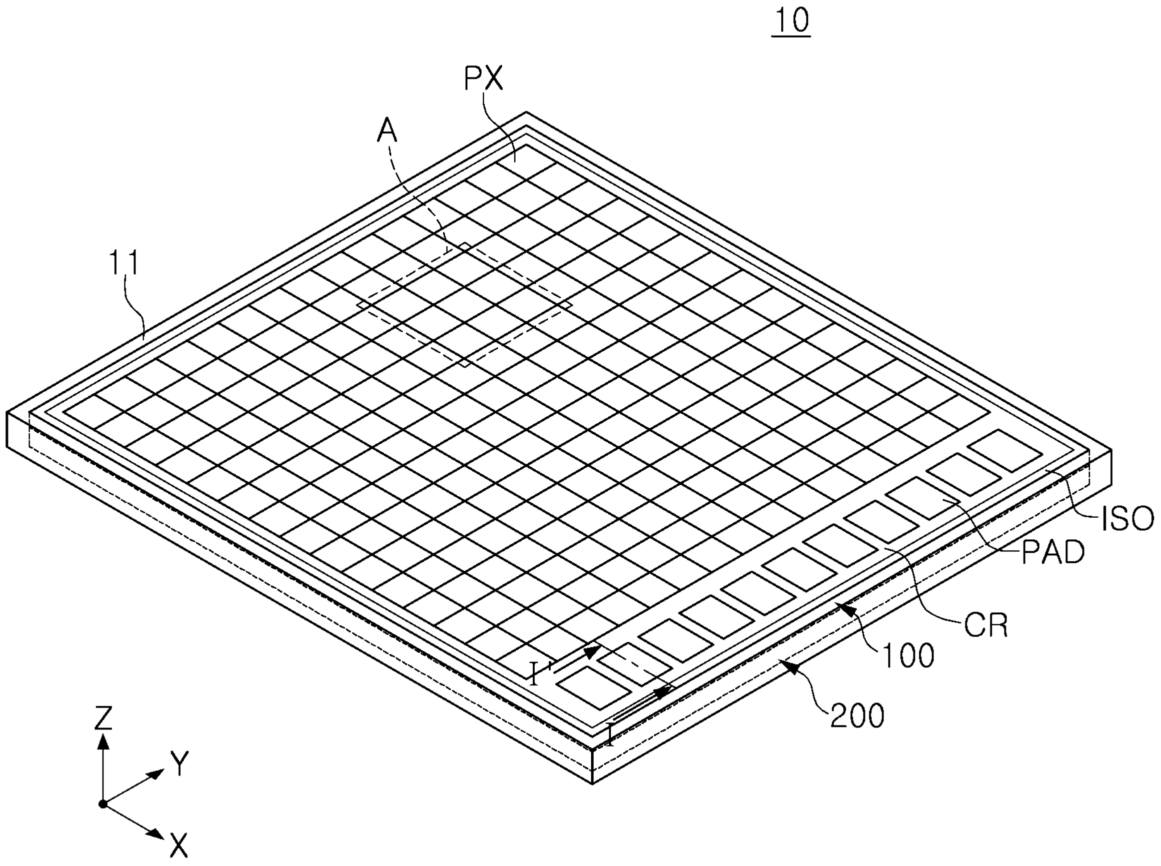
FIG. 1 is a schematic perspective view of a display apparatus according to example embodiments.
Figure 2:
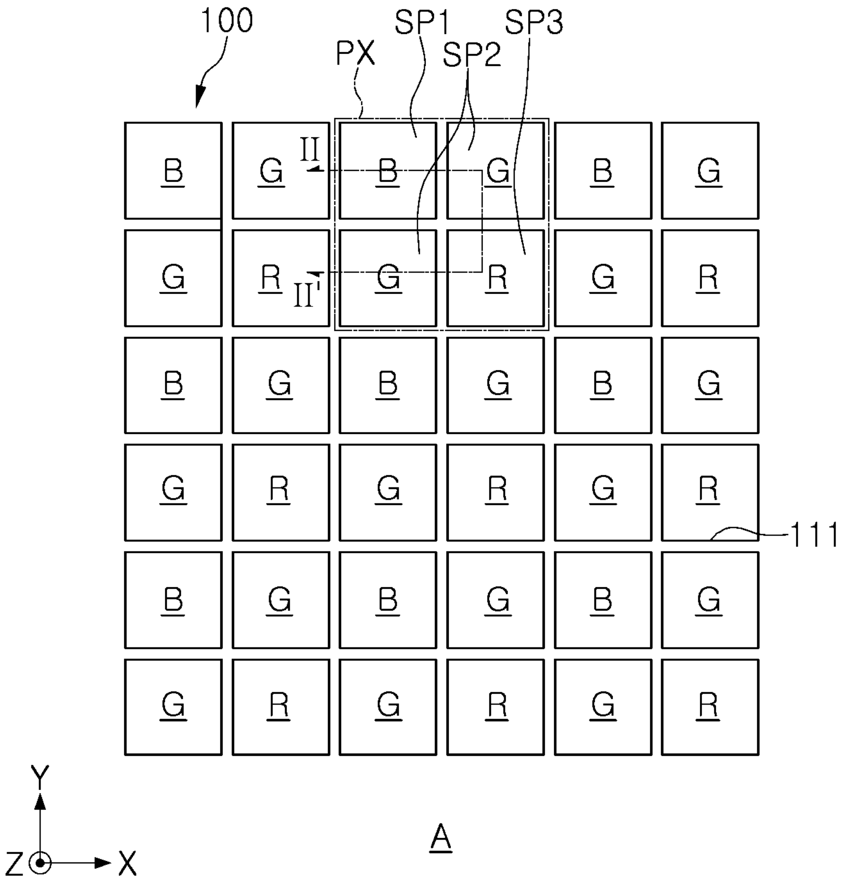
FIG. 2 is an enlarged plan view illustrating portion "A" of FIG. 1.

FIG. 1 is a schematic perspective view of a display apparatus according to example embodiments, and FIG. 2 is a schematic plan view illustrating a display apparatus according to example embodiments. Here, FIG. 2 is an enlarged plan view illustrating portion "A" of FIG. 1

Referring to FIGS. 1 and 2, a display apparatus 10 according to an example embodiment includes a circuit board 200 including driving circuits and a pixel array 100 arranged on the circuit board 200 and having a plurality of pixels PX disposed therein. The display apparatus 10 may further include a frame 11 surrounding the circuit board 200 and the pixel array 100.

The circuit board 200 may be a driving circuit board including transistor cells. In other example embodiments, the circuit board 200 may include only some of the driving circuits for the display apparatus, in which case the display apparatus 10 may further include other driving devices. In some example embodiments, the circuit board 200 may implement a variable or curved display apparatus by including a flexible substrate.

In addition to the plurality of pixels PX, the pixel array 100 may further include connection pads PAD, a connection region CR for connecting the plurality of pixels PX to connection pads PAD, and an edge region ISO.

Each of the plurality of pixels PX may include first to third sub-pixels SP1, SP2 and SP3 configured to mutually emit a specific wavelength, for example, light of a specific color, so as to provide a color image. For example, the first to third sub-pixels SP1, SP2 and SP3 may be configured to emit blue (B) light, green (G) light, and red (R) light, respectively. In each pixel PX, the first to third sub-pixels SP1, SP2 and SP3 may be disposed in, for example, a Bayer pattern. Specifically, each pixel PX may include first and third sub-pixels SP1 and SP3 disposed in a first diagonal direction and two second sub-pixels SP2 disposed in a second diagonal direction, intersecting the first diagonal direction, as illustrated in FIG. 2.

An X-direction and a Y-direction are perpendicular to each other, and are parallel to an upper surface of the display apparatus 10. A Z-direction is a direction, perpendicular to the X-direction and the Y-direction, that is, a direction, perpendicular to the upper surface of the display apparatus 10.

In FIG. 2, each pixel PX is illustrated in a form in which the first to third sub-pixels SP1, SP2 and SP3 are disposed in a 2×2 Bayer pattern, but the present disclosure is not limited thereto, and in other example embodiments, each pixel PX may be configured in a different arrangement such as a 3×3 or 4×4 pattern. Furthermore, in some example embodiments, some sub-pixels may be configured to emit colors different from the exemplified colors (R, G and B), such as yellow light. In the pixel array 100 of FIG. 1, the plurality of pixels PX are illustrated in a form arranged in a 15×15 pattern, but columns and rows may be implemented in any suitable number, such as 1,024×768. For example, the plurality of pixels PX may have different arrangements depending on the desired resolution.

The connection pads PAD may be disposed on at least one side of the plurality of pixels PX along an edge of the display apparatus 10. The connection pads PAD may be electrically connected to the plurality of pixels PX and the driving circuits of the circuit board 200. The connection pads PAD may electrically connect an external apparatus to the display apparatus 10. In some example embodiments, the number of connection pads PAD may vary, and may be determined by, for example, the number of pixels PX and a driving method of the driving circuit in the circuit board 200.

The connection region CR may be a region disposed between the plurality of pixels PX and the connection pads PAD. A wiring structure electrically connected to the plurality of pixels PX, for example, a common electrode, may be disposed in the connection region CR.

The edge region ISO may be a region along edges of the pixel array 100. The edge region ISO may be a region in which an upper semiconductor layer 111 is not disposed, as described below with reference to FIG. 3.

The frame 11 may be disposed around the pixel array 100 and may be provided as a guide defining an arrangement space of the pixel array 100. The frame 11 may include at least one materials such as a polymer, a ceramic, a semiconductor, or a metal.

Figure 3:
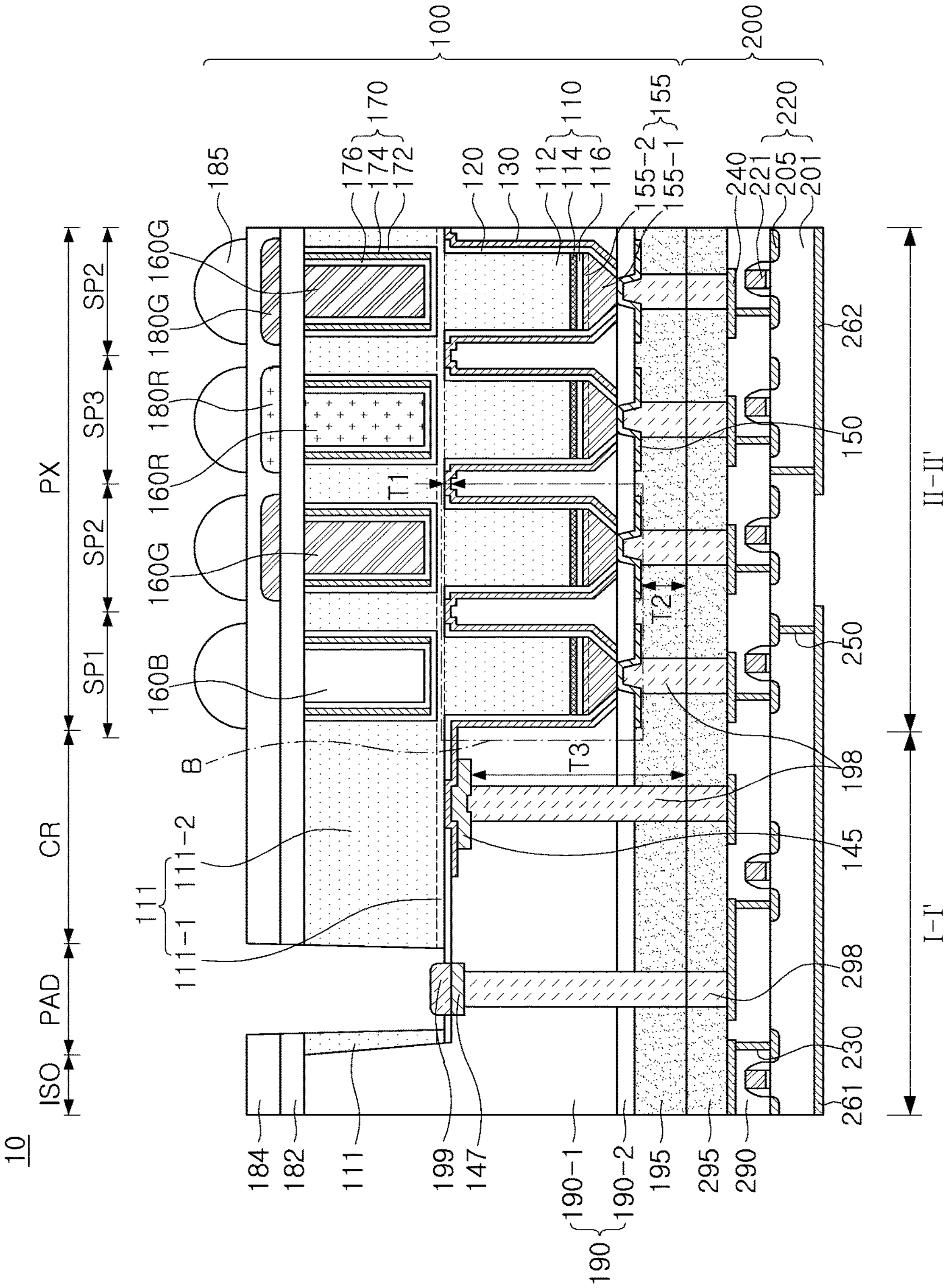
FIG. 3 is a schematic cross-sectional view of a display apparatus according to example embodiments.
Figure 4:
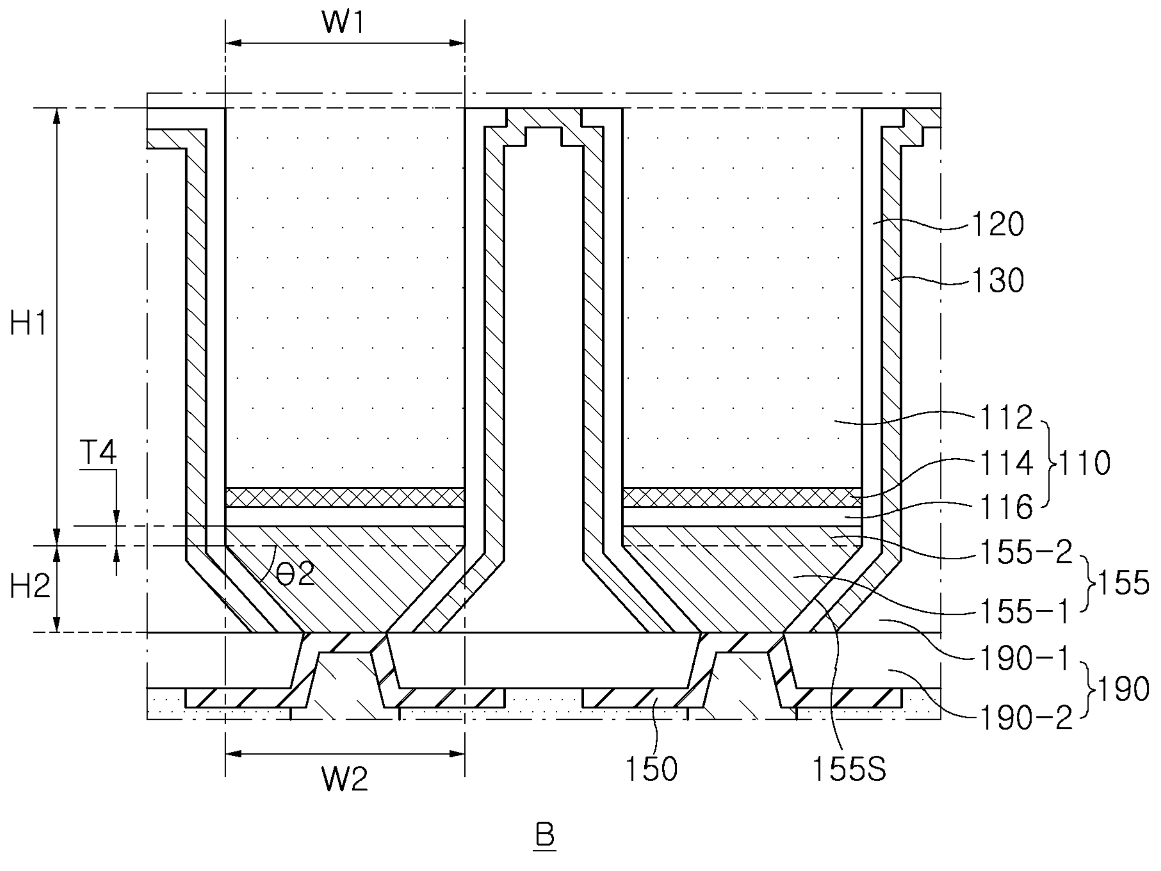
FIG. 4 is a partial enlarged view illustrating portion "B" of FIG. 3.

FIG. 3 is a schematic cross-sectional view illustrating a display apparatus according to example embodiments, and FIG. 4 is a partial enlarged view illustrating portion "B" of FIG. 3. Here, each of the cross-sections of FIG. 3 may be understood as a cross-section taken along line I-I' of FIG. 1 and a cross section taken along line II-II' of FIG. 2.

Referring to FIGS. 3 and 4, a display apparatus 10 includes a circuit board 200 and a pixel array 100 disposed on the circuit board 200.

The circuit board 200 may include a semiconductor substrate 201, a driving circuit including driving elements 220 including transistor cells formed on the semiconductor substrate 201, interconnecting portions 230 electrically connected to the driving elements 220, wiring lines 240 on the interconnecting portions 230, and a circuit insulating layer 290 covering the driving circuit. The circuit board 200 may further include a first bonding insulating layer 295 on the circuit insulating layer 290, and first bonding electrodes 298 disposed in the first bonding insulating layer 295 and connected to the wiring lines 140.

The semiconductor substrate 201 may include impurity regions including source/drain regions 205. Examples of the semiconductor substrate 201 may include semiconductors such as silicon (Si) or germanium (Ge), or compound semiconductors such as SiGe, SiC, GaAs, InAs, or InP. The semiconductor substrate 201 may further include through electrodes 250 such as a through silicon via (TSV) connected to the driving circuit and first and second substrate wiring lines 261 and 262 connected to the through electrodes 250.

Figure 7:
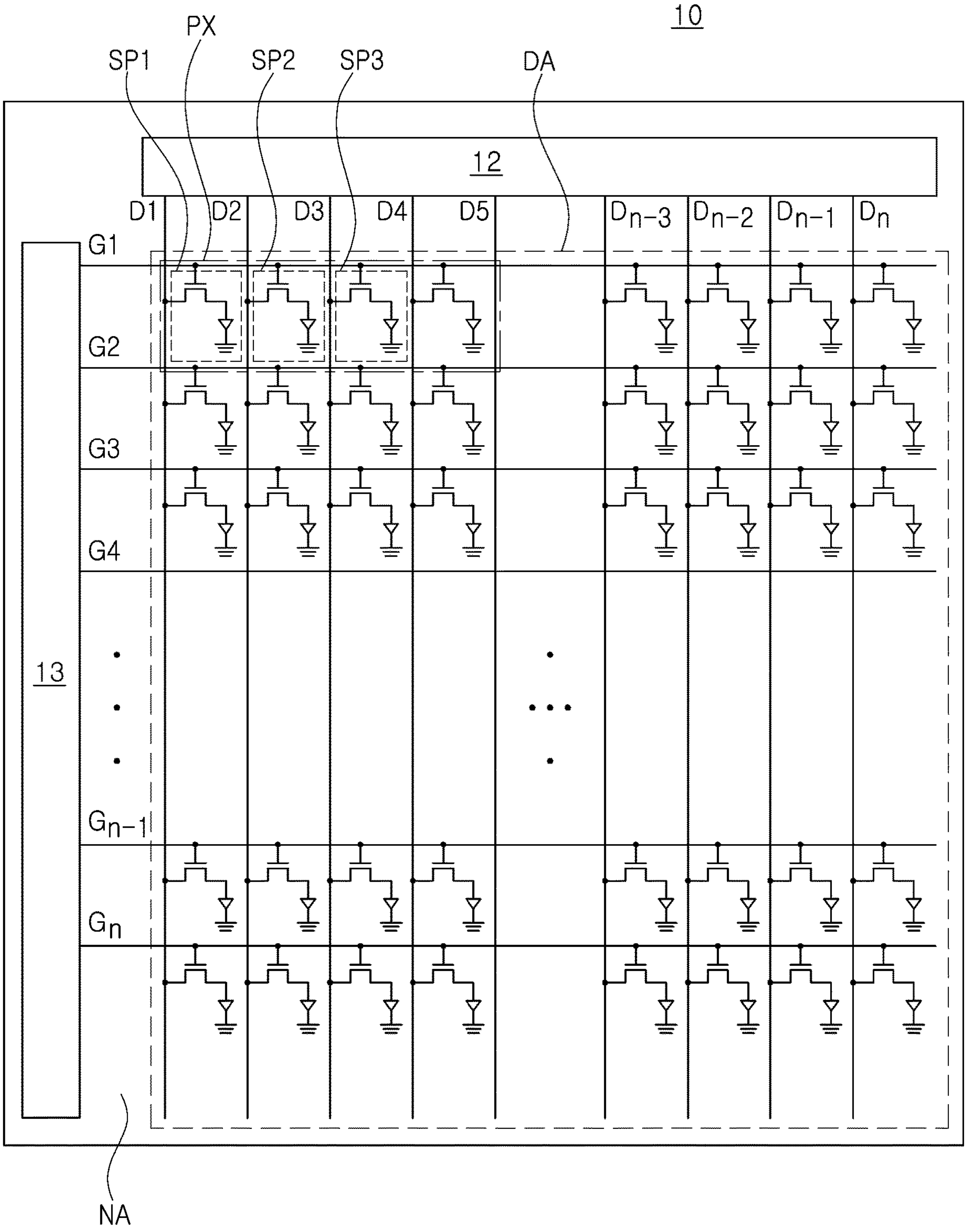
FIG. 7 is a view illustrating a driving circuit implemented in a display apparatus according to example embodiments.

The driving circuit may include a circuit for controlling driving of a pixel, specifically, a sub-pixel. A source region 205 of the transistor cells may be electrically connected to one-sided electrode of LED cells 110 through the interconnecting portions 230, the wiring line 240, and the first bonding electrode 298. For example, a drain region 205 of the transistor cells may be connected to the first wiring line 261 through the through electrode 250, and the first wiring line 261 may be connected to data lines D1, D2, . . . , and Dn (FIG. 7). Gate electrodes 221 of the transistor cells may be connected to the second wiring line 262 through the through electrode 250, and the second wiring line 262 may be connected to gate lines G1, G2, . . . , and Gn (FIG. 7). Such a circuit configuration and operation will be described in more detail below with reference to FIG. 7.

Upper surfaces of the first bonding electrodes 298 and upper surfaces of the first bonding insulating layer 295 may form an upper surface of the circuit board 200. The first bonding electrodes 298 may be bonded to second bonding electrodes 198 of the pixel array 100 to provide an electrical connection path. The first bonding electrodes 298 may include a conductive material, for example, copper (Cu). The first bonding insulating layer 295 may be bonded to the second bonding insulating layer 195 of the pixel array 100. The first bonding insulating layer 295 may include, for example, at least one of SiO, SiN, SiCN, SiOC, SiON, and SiOCN.

The pixel array 100 may include an upper semiconductor layer 111, LED cells 110 on a lower surface of the upper semiconductor layer 111, transparent electrodes 155 on lower surfaces of the LED cells 110, a passivation layer 120 covering side surfaces of the LED cells 110, and first and second reflective electrodes 130 and 150 electrically connected to the LED cells 110. The pixel array 100 may include wavelength converters 160R, 160G and 160B on the LED cells 110, color filters 180R and 180G, and microlenses 185. The pixel array 100 may further include partition reflective layers 170 surrounding side surfaces and lower surfaces of the wavelength converters 160R, 160G and 160B, a sealing layer 182 and a planarization layer 184 on the wavelength converters 160R, 160G and 160B, a common electrode 145, a first pad electrode 147, a wiring insulating layer 190, a second bonding insulating layer 195, second bonding electrodes 198, and a second pad electrode 199.

The upper semiconductor layer 111 may be disposed on the LED cells 110. The upper semiconductor layer 111 may have a partition structure surrounding the side surfaces of the wavelength converters 160R, 160G and 160B and separating the wavelength converters 160R, 160G and 160B from each other, in pixels PX. By the partition structure of the upper semiconductor layer 111, light emitted from the LED cells 110 may be emitted through the wavelength converters 160R, 160G and 160B without interfering with each other. The upper semiconductor layer 111 may have side surfaces that are perpendicular to the Z-direction or inclined in the Z-direction, between the wavelength converters 160R, 160G and 160B. For example, in some example embodiments, the upper semiconductor layer 111 may have inclined side surfaces such that a width of an upper portion is narrower than a width of a lower portion. The upper semiconductor layer 111 may be disposed to extend in a connection region CR to form a continuous layer, rather than a partition structure, and may extend, for example, onto the common electrode 145. The upper semiconductor layer 111 may be disposed in the connection pad PAD in a form in which at least a portion thereof is removed, and may not be disposed in the edge region ISO.

The upper semiconductor layer 111 may include a region continued with a first conductivity-type semiconductor layer 112 of the LED cells 110. The upper semiconductor layer 111 may be a layer grown during a growth process of the LED cells 110. For example, the upper semiconductor layer 111 may include an epitaxial nitride semiconductor layer. The upper semiconductor layer 111 may include the same material as the first conductivity-type semiconductor layer 112. For example, the upper semiconductor layer 111 includes a first region 111-1 in contact with the first conductivity-type semiconductor layer 112, and the first region 111-1 may be doped with the same polarity as the first conductivity-type semiconductor layer 112. An impurity concentration of the first region 111-1 may be higher than an average impurity concentration of the first conductivity-type semiconductor layer 112. The upper semiconductor layer 111 may further include an undoped second region 111-2. The first region 111-1 may overlap the LED cells 110 in the Z-direction, and may also overlap the wavelength converters 160R, 160G and 160B in the Z-direction. The first regions may be connected to each other between the LED cells and disposed in a single layer.

An interface between the upper semiconductor layer 111 and the first conductivity-type semiconductor layer 112 is distinguished and recognized based on positions of upper ends of each of the LED cells 110 having a pillar (e.g., a column) shape. A thickness T1 of the first region 111-1 of the upper semiconductor layer 111 may range, for example, from about 0.1 μm to about 1.0 μm.

The LED cells 110 may constitute each of the first to third sub-pixels SP1, SP2 and SP3, and may respectively constitute a micro LED. The LED cells 110 may be arranged in columns and rows. The LED cells 110 may generate blue light, for example, light having a wavelength of 435 nm to 460 nm. Each of the LED cells 110 may include the first conductivity-type semiconductor layer 112, an active layer 114, and a second conductivity-type semiconductor layer 116, sequentially stacked on the lower surface of the upper semiconductor layer 111.

The first conductivity-type semiconductor layer 112, the active layer 114, and the second conductivity-type semiconductor layer 116 may be formed of a nitride semiconductor, and may be an epitaxial layer. The first conductivity-type semiconductor layer 112 and the second conductivity-type semiconductor layer 116 may be respectively N-type and P-type nitride semiconductor layers having a composition of $In_xAl_yGa_{1-x-y}N$ ($0 \le x < 1$, $0 \le y < 1$, $0 \le x+y < 1$). For example, the first conductivity-type semiconductor layer 112 may be an N-type gallium nitride (n-GaN) layer doped with silicon (Si), germanium (Ge), or carbon (C), and the second conductivity-type semiconductor layer 116 may be a P-type gallium nitride (p-GaN) layer doped with magnesium (Mg) or zinc (Zn). However, in some example embodiments, the first conductivity-type semiconductor layer 112 and the second conductivity-type semiconductor layer 116 may be formed of an aluminum indium gallium phosphide (AlInGaP)-based semiconductor layer or an aluminum indium gallium arsenide (AlInGaAs)-based semiconductor layer, in addition to the nitride semiconductor. Each of the first conductivity-type semiconductor layer 112 and the second conductivity-type semiconductor layer 116 may be formed as a single layer, but may include a plurality of layers having different characteristics such as a doping concentration, a composition, or the like.

The active layer 114 may emit light having a predetermined energy by recombination of electrons and holes. The active layer 114 may have a single (SQW) structure or a multiple quantum well (MQW) structure, in which quantum barrier layers and quantum well layers are alternately disposed with each other. For example, the quantum well layer and the quantum barrier layer may be and $In_xAl_yGa_{1-x-y}N$ ($0 \leq x \leq 1$, $0 \leq y \leq 1$, $0 \leq x+y \leq 1$) layer having different compositions. For example, the quantum well layer may be an $In_xGa_{1-x}$ ($0<x \leq 1$) layer, and the quantum barrier layer may be a GaN layer or an AlGaN layer.

In each of the LED cells 110, an angle θ between the lower surface and the side surfaces thereof may be a right angle or an angle similar to the right angle. For example, the angle θ may range from about 85 degrees to about 95 degrees. Each of the LED cells 110 may have a pillar shape in which a width W1 (FIG. 4) thereof is 100 μm or less, and the width W1 may be less than a height H1 (FIG. 4) thereof. The width W1 of the LED cell 110 may be 100 nm or more and 10 μm or less, and, more preferably, 500 nm or more and 1,500 nm or less. The height H1 of the LED cell 110 may be 2.5 times or more and 6 times or less of the width W1. As the display becomes high-resolution, the LED cell 110 becomes finer, and the width W1 is further reduced compared to the height H1. The amount of light absorbed into the LED cell among the light generated by the active layer 114 increases, and accordingly, it is necessary to increase the light extraction efficiency.

The transparent electrodes 155 may be disposed on lower surfaces of the second conductivity-type semiconductor layers 116 and connected to the second conductivity-type semiconductor layers 116. The transparent electrode 155 may be disposed to cover, for example, an entire lower surface of the second conductivity-type semiconductor layer 116. Referring to FIGS. 5A-5F, perspective views FIGS. 5A, 5B and 5C and plan cross-sectional views FIGS. 5D, 5E and 5F of various LED cells that can be employed in a display apparatus, according to example embodiments, are illustrated.

Figure 5A:
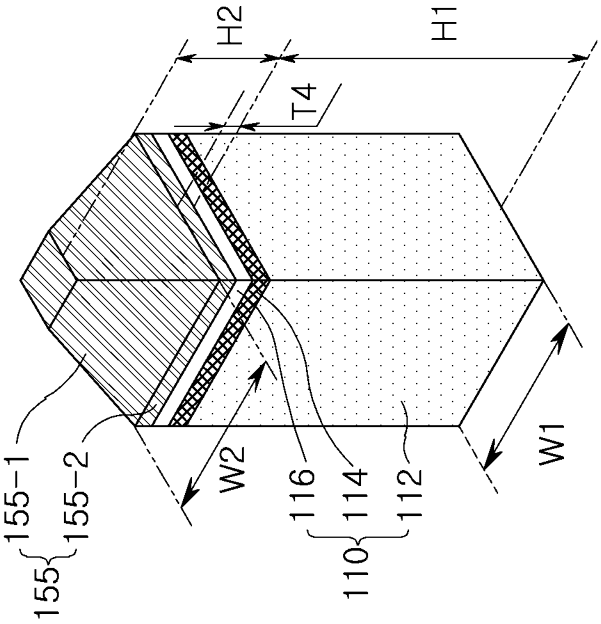
FIGS. 5A-5F are perspective views and cross-sectional views illustrating an LED cell and first and second reflective electrodes of a display apparatus in a horizontal direction according to example embodiments.
Figure 5B:
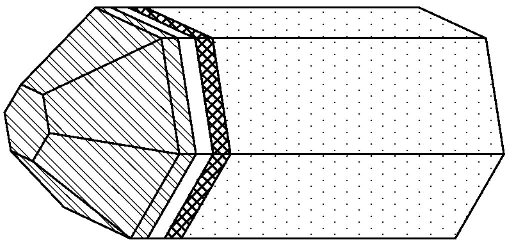
Figure 5C:
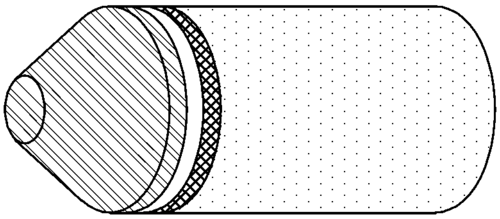
Figure 5D:
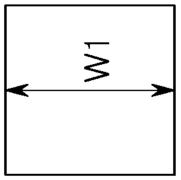

Referring to FIGS. 5A and 5D, the LED cell 110 may have a square pillar shape, as illustrated. The transparent electrode 155 has a quadrangular pyramid structure and includes an inclined portion 155-1 having a constant inclination. An inclined surface 155S (FIG. 4), which is an external surface of the inclined portion 155-1, may have an inclination of 40 degrees to 70 degrees. A width W1 of the LED cell 110 may be defined as a distance between opposite sides (see FIG. 5D).

Figure 5E:
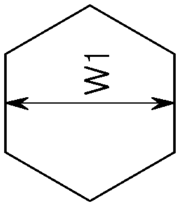

Similarly thereto, referring to FIG. 5B and FIG. 5E, the LED cell 110 may have a hexagonal pillar shape, as illustrated. The transparent electrode 155 has a hexagonal pyramid structure and includes an inclined portion 155-1 having a constant inclination. For example, an inclined surface 155S, which is an external surface of the inclined portion 155-1, may have an inclination of 40 degrees to 70 degrees. A width W1 of the LED cell 110 may also be defined as a distance between opposite sides (see FIG. 5E).

Figure 5F:
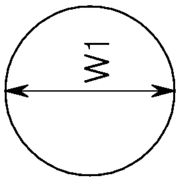

Furthermore, referring to FIG. 5C and FIG. 5F, the LED cell 110 may have a cylindrical shape. The transparent electrode 155 has a cone structure and includes an inclined portion 155-1 having a constant inclination. For example, an inclined surface 155S, which is an external surface of the inclined portion 155-1, may have an inclination of 40 degrees to 70 degrees. A width W1 of the LED cell 110 may also be defined as a distance between opposite sides (i.e., the diameter of the cylinder) (see FIG. 5E).

As described above, the LED cell 110 adoptable in the present embodiment may have various pillar shapes. Furthermore, the transparent electrode 155 may include an inclined portions 155-1 in the shape of a cone or various pyramids. A light path may be changed by the inclined surface 155S, thereby increasing light extraction efficiency. An inclination of the inclined surface 155S is measured based on a horizontal surface such as an interface between the transparent electrode 155 and the first conductivity-type semiconductor layer 116. The transparent electrode 155 may have a substantially flat cross-section at a lower end far from the LED cells 110. Such a cross-section may have a round shape or an angular structure (i.e., a polygonal shape) from a plan view (see FIGS. 5A, B and C).

The transparent electrodes 155 may include a buffer portion 155-2 having a pillar shape and disposed between the inclined portion 155-1 and the LED cells 110. The buffer portion 155-2 may prevent plasma damage applied to the second conductivity-type semiconductor layer 116 during an etching process that forms the LED cell 110 and the transparent electrode 155, but when the buffer portion 155-2 is excessively thick, efficiency may decrease due to absorption of light by the transparent electrode 155. A thickness T4 of the buffer portion 155-2 may be 5 nm to 100 nm, preferably 7 nm to 20 nm. A height H2 of the transparent electrode 155 may be 0.32 times or more and 1.12 times or less of a width W2 thereof, and may be 12% or more and 20% or less of the height H1 of the LED cell 110. An inclination θ2 (FIG. 4) of a side surface of the buffer portion 155-2 may be 85 degrees to 95 degrees. A side surface of the buffer portion 155-2 may be a surface continuous with a side surface of the LED cell 110.

When a planar perspective seen from an upper portion (for example, a Z-direction) of each of the LED cells, an area ratio occupied by inclined side surfaces of the transparent electrodes among the total planar area of the transparent electrodes may be 50% or more. In other words, when an upper surface of the transparent electrode 155 is projected onto a horizontal plane, a ratio of a projected area of the inclined surface 155S to the projected area may be 50% or more, and preferably 80% or more.

The transparent electrodes 155 may include a transparent conductive material, and may include, for example, at least one of ITO, ZnO, ZITO, ZIO, GIO, ZTO, GTO, ZT, and AZO.

The LED cells 110 and the transparent electrodes 155 may have the structure as described above by sequentially performing a dry etching process and a wet etching process, as described below with reference to FIG. 8E.

The passivation layer 120 may cover the side surfaces of the LED cells 110 and may extend onto the inclined surface 155S of the transparent electrode 155. A lower end of the passivation layer 120 may be on the same level as the lower end of the transparent electrodes 155 and may be on the same level as a lower end of a second reflective electrodes 150. The passivation layer 120 may also extend to a connection region CR and a connection pad PAD. The passivation layer 120 may be disposed to cover the lower surface of the upper semiconductor 111 in the connection region CR and the connection pad PAD. The passivation layer 120 may include insulating materials such as at least one of $SiO_2$, SiN, SiCN, SiOC, SiON, and SiOCN.

The second reflective electrodes 150 are electrically connected to the second conductivity-type semiconductor layer 116 through the transparent electrode 155. The second reflective electrodes 150 may be disposed to overlap the LED cells 110 in the Z-direction below each of the LED cells 110. The second reflective electrodes 150 may be connected to the transparent electrode 155 through an opening at a lower end of the passivation layer 120. The second reflective electrodes 150 may be disposed on a wiring insulating layer 190 and connected to the transparent electrode 155 by passing through the wiring insulating layer 190. The second reflective electrodes 150 may be in contact with the passivation layer 120 and may extend along the side surface of the transparent electrode 155. Furthermore, the second reflective electrodes 150 may extend along the side surfaces of the LED cells 110. In some example embodiments, the second reflective electrodes 150 may be omitted, and the transparent electrodes 155 may be directly connected to the first bonding electrodes 198.

The second reflective electrodes 150 may include a highly reflective metal, for example, at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au).

The first reflective electrode 130 is electrically connected to the first conductivity-type semiconductor layer 112. The first reflective electrode 130 is in contact with the first region 111-1 of the upper semiconductor layer 111 and may be connected to the first conductivity-type semiconductor layer 112 through the first region 111-1. The first reflective electrode 130 may be disposed on the side surfaces of the LED cell 110 and spaced apart from the LED cell 110 by the passivation layer 120, and may extend externally to the LED cell 110. The first reflective electrode 130 extending externally may be connected in regions between adjacent LED cells 110 and disposed in a single layer. The first reflective electrode 130 may have a shape extending from one side surface of one LED cell 110 to an opposite side surface of an adjacent LED cell 110. The first reflective electrode 130 may be disposed in an inverted U-shape between the adjacent LED cells 110.

The first reflective electrode 130 may extend onto the inclined surface 155S of the transparent electrode 155 along the passivation layer 120, and may be on the same lower level as that of the passivation layer 120. The first reflective electrode 130 may constitute an omnidirectional reflector (ODR) together with the passivation layer 120.

A region in which the first reflective electrode 130 be in contact with the upper semiconductor layer 111 may be disposed not to overlap the wavelength converters 160R, 160G and 160B in the Z-direction, but the present disclosure is not limited thereto. The first reflective electrode 130 may extend from an outermost portion of the pixels PX to the connection region CR, may be connected to the first conductivity-type semiconductor layer 112, and may be physically and electrically connected to the common electrode 145. Lines forming the first reflective electrode 130 may be connected to the common electrode 145 at ends thereof.

Figure 6:
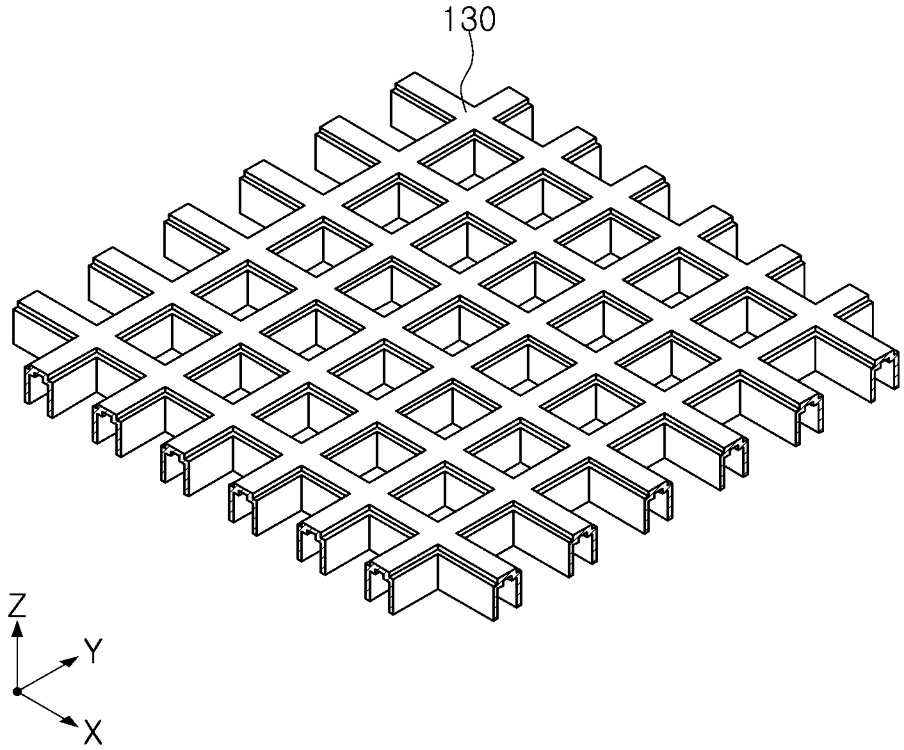
FIG. 6 is a schematic perspective view illustrating a first reflective electrode of a display apparatus according to example embodiments.

FIG. 6 is a schematic perspective view of a first reflective electrode 130 of a display apparatus according to example embodiments.

Referring to FIG. 6, the first reflective electrode 130 may include lines extending in the X-direction and the Y-direction, along regions between pixels PX and first to third sub-pixels SP1, SP2 and SP3. The lines may extend along boundaries of the LED cells 110. The lines of the first reflective electrode 130 may be connected to each other to form a grid shape or a mesh shape. In the first reflective electrode 130, outermost lines extending from one side surface of the LED cell 110 and disposed in a line form may be further disposed in an outermost portion of the lines, and the outermost lines may be connected to the common electrode 145, as illustrated in FIG. 3.

The first reflective electrode 130 may include a metal, for example, at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au). In some example embodiments, the first reflective electrode 130 may have a single layer structure or a multilayer structure of a conductive material.

The wavelength converters 160R, 160G and 160B may be respectively disposed on LED cells 110. Each of the wavelength converters 160R, 160G and 160B may be a region in which wavelength conversion materials such as quantum dots are filled and hardened inside a partition structure of the upper semiconductor layer 111 while being dispersed in a liquid binder resin. A first wavelength converter 160R and a second wavelength converter 160G may include quantum dots capable of performing wavelength conversion of blue light into red light and green light, respectively, and a third wavelength converter 160B may be a separate transparent resin portion formed by including only binder resin without separate quantum dots.

Partition reflective layers 170 may be disposed inside the barrier structure of the upper semiconductor layer 111 to surround side surfaces and lower surfaces of the wavelength converters 160R, 160G and 160B. The partition reflective layers 170 may include a first partition insulating layer 172, a partition metal layer 174, and a second partition insulating layer 176, respectively, disposed sequentially from the bottom. The partition metal layer 174 may be disposed only on the side surfaces of the wavelength converters 160R, 160G and 160B, and may not be disposed below the lower surfaces thereof. The lower surfaces of the partition reflective layers 170 may be disposed on a level higher than an uppermost surface of the first reflective electrode 130. The first partition insulating layer 172 and the second partition insulating layer 176 may include an insulating material, for example, at least one of $SiO_2$, SiN, SiCN, SiOC, SiON, and SiOCN. The partition metal layer 174 may include a reflective metal, for example, at least one of silver (Ag), nickel (Ni), and aluminum (Al).

A sealing layer 182 may be disposed to cover the upper surfaces of the wavelength converters 160R, 160G and 160B. The sealing layer 182 may function as a protective layer for preventing deterioration of the wavelength converters 160R, 160G and 160B. In some example embodiments, the sealing layer 182 may be omitted.

Color filters 180R and 180G may be disposed in second and third sub-pixels SP2 and SP3 and on the wavelength converters 160R, 160G, and 160B. The color filters 180R and 180G may increase the color purity of light emitted through the first wavelength converter 160R and the second wavelength converter 160G. In some example embodiments, a color filter may be further disposed on the third wavelength converter 160B.

A planarization layer 184 may be disposed to cover the upper surfaces of the color filters 180R and 180G and the sealing layer 182. The planarization layer 184 may be a transparent layer.

The microlenses 185 may be disposed to correspond to the wavelength converters 160R, 160G and 160B on the planarization layer 184, respectively. The microlenses 185 may converge light incident from the wavelength converters 160R, 160G and 160B. For example, the microlenses 185 may have a diameter larger than a width W1 of the LED cells 110 in the X-direction and the Y-direction. The microlenses

185 may be formed of, for example, a transparent photoresist material or a transparent thermosetting resin film.

A common electrode 145 and a first pad electrode 147 may be disposed in a connection region CR and a connection pad PAD, respectively. The common electrode 145 may be disposed on a lower surface of a first reflective electrode 130 extending from the pixel PX to connect the first reflective electrode 130 to the second bonding electrode 198. The common electrode 145 and the first reflective electrode 130 may form a common electrode structure. The common electrode 145 may be arranged in a square ring shape or a ring shape to surround all pixels PX in a plan view, and may be connected to ends of the first reflective electrode 130. However, an arrangement of the common electrode 145 is not limited thereto and may have various shapes and configurations in example embodiments. The first pad electrode 147 may be disposed below a second pad electrode 199 in the connection pad PAD, and may connect the second pad electrode 199 and the second bonding electrode 198. The common electrode 145 and the first pad electrode 147 may include a conductive material, for example, at least one of silver (Ag), nickel (Ni), aluminum (Al), chromium (Cr), rhodium (Rh), iridium (Ir), palladium (Pd), ruthenium (Ru), magnesium (Mg), zinc (Zn), platinum (Pt), and gold (Au).

The second pad electrode 199 may be disposed on the first pad electrode 147 and in the connection pad (PAD). The second pad electrode 199 may be disposed so that at least an upper surface thereof is exposed upwardly through an opening penetrating through the upper semiconductor layer 111 and the first conductivity-type semiconductor layer 112. The second pad electrode 199 may be connected to an external device, such as an external circuit (External IC) configured to apply an electrical signal to a circuit board 200, by wire bonding or anisotropic conductive film (AFC) bonding. The second pad electrode 199 may electrically connect the driving circuits of the circuit board 200 and the external device. The second pad electrode 199 may include a metal, such as gold (Au), silver (Ag), or nickel (Ni).

The second bonding electrodes 198 may connect the second reflective electrodes 150, the common electrode 145, and the first pad electrode 147 to the first bonding electrodes 298 of the circuit board 200. In the pixel PX, the second bonding electrodes 198 may be connected to the second reflective electrodes 150 below the second reflective electrodes 150, and in the connection region CR, the second bonding electrodes 198 may be connected to the common electrode 145, and in the connection pad PAD, the second bonding electrodes 198 may be connected to the first pad electrode 147. Among the second bonding electrodes 198, the second bonding electrodes 198 connected to the second reflective electrodes 150 may have a second thickness T2 or a second height, and the second bonding electrodes 198 connected to the common electrode 145 and the first pad electrode 147 may have a third thickness T3 thicker than the second thickness T2 or a second height. The first reflective electrode 130 may be connected to the second bonding electrodes 198 through the common electrode 145, and the second reflective electrodes 150 may be directly connected to the second bonding electrodes 198.

The second bonding electrodes 198 may be disposed to penetrate through a wire insulating layer 190 and a second bonding insulating layer 195. The second bonding electrodes 198 may have a pillar shape, such as a cylinder. In some example embodiments, the second bonding electrodes 198 may have sidewalls inclined so that a size of an upper surface thereof is smaller than that of a lower surface thereof. The second bonding electrodes 198 may include, for example, copper (Cu). The second bonding electrodes 198 may further include a barrier metal layer, for example, a tantalum (Ta) layer and/or a tantalum nitride (TaN) layer, on an upper surface and side surfaces thereof.

The wire insulating layer 190 may be disposed below the LED cells 110 and the upper semiconductor layer 111, along with the second bonding insulating layer 195. The wiring insulating layer 190 may be disposed below an inclined surface 155S of transparent electrodes 155. Furthermore, the wiring insulating layer 190 may fill a space between the LED cells 110. The wiring insulating layer 190 includes a first layer 190-1 covering the inclined surface 155S of the transparent electrode 155 and a second layer 190-2 covering a lower surface of the first layer 190-1, and a level of an interface between the first layer 190-1 and the second layer 190-2 may be equal to a level of a lower level of the first reflective electrode 130, a level of a lower end of the passivation layer 120, or both levels thereof simultaneously. The wiring insulating layer 190 may be formed integrally. The wiring insulating layer 190 may include silicon oxide or a silicon oxide-based insulating material, for example, TetraEthyl Ortho Silicate (TEOS), Undoped Silicate Glass (USG), PhosphoSilicate Glass (PSG), and Borosilicate Glass (BSG), BoroPhosphoSilicate Glass (BPSG), Fluoride Silicate Glass (FSG), Spin On Glass (SOG), Tonen SilaZene (TOSZ), or a combination thereof.

The lower surfaces of the second bonding insulating layer 195 may be disposed to form a lower surface of the pixel array 100, together with lower surfaces of the second bonding electrodes 198. The second bonding insulating layer 195 may form dielectric-dielectric bonding with the first bonding insulating layer 295. The circuit board 200 and the pixel array 100 may be bonded to each other by bonding the first bonding electrodes 298 and the second bonding electrodes 198 and bonding the first bonding insulating layer 295 and the second bonding insulating layer 195. The bonding between the first bonding electrodes 298 and the second bonding electrodes 198 may be, for example, copper (Cu)-copper (Cu) bonding, and the bonding between the first bonding insulating layer 295 and the second bonding insulating layer 195 may be, for example, dielectric-dielectric bonding such as SiCN—SiCN bonding. The circuit board 200 and the pixel array 100 may be bonded to each other by hybrid bonding including copper (Cu)-copper (Cu) bonding and dielectric-dielectric bonding, and may be bonded without a separate adhesive layer.

The display apparatus 10 according to an example embodiment may optimize an arrangement of the electrode structure including the first reflective electrode 130, and may bond the circuit board 200 and the pixel array 100 using the hybrid bonding, thereby implementing and realizing a miniaturized, high-resolution apparatus.

FIG. 7 is a driving circuit implemented in a display apparatus according to example embodiments.

Referring to FIG. 7, a circuit diagram of a display apparatus 10 in which nXn sub-pixels are arranged is illustrated. First to third sub-pixels SP1, SP2 and SP3 may respectively accommodate data signals through data lines D1 to Dn, which are paths in a vertical direction, for example, paths in a row direction. The first to third sub-pixels SP1, SP2 and SP3 may accommodate a control signal, that is, a gate signal, through gate lines G1 to Gn, which are paths in a horizontal direction, for example, paths in a column direction.

A plurality of pixels PX including the first to third sub-pixels SP1, SP2 and SP3 provide an active region DA for display, and the active region DA is provided as a display region for a user. A non-active region NA may be formed along one or more edges of the active region DA. The non-active region NA extends along an external periphery of a panel of the display apparatus 10 and is a region in which the pixels PX are not present, and may correspond to a frame 11 of the display apparatus 10 (see FIG. 1).

First and second driver circuits 12 and 13 may be adopted to control operations of the pixels PX, that is, operations of the first to third sub-pixels SP1, SP2 and SP3. Some or all of the first and second driver circuits 12 and 13 may be implemented on the circuit board 200. The first and second driver circuits 12 and 13 may be formed of integrated circuits, thin film transistor panel circuits, or other suitable circuits, and may be disposed in the non-active region NA of the display apparatus 10. The first and second driver circuits 12 and 13 may include a microprocessor, a memory such as storage, processing circuitry, and communication circuitry.

In order to display an image by the pixels PX, a first driver circuit 12 may supply image data to the data lines DI to Dn and simultaneously provide a clock signal and other control signals to a second driver circuit 13 as a gate driver circuit. The second driver circuit 13 may be implemented using an integrated circuit and/or a thin film transistor circuit. A gate signal for controlling the first to third sub-pixels SP1, SP2 and SP3 disposed in a column direction may be transmitted through gate lines G1 to Gn of the display apparatus 10.

Figure 8A:
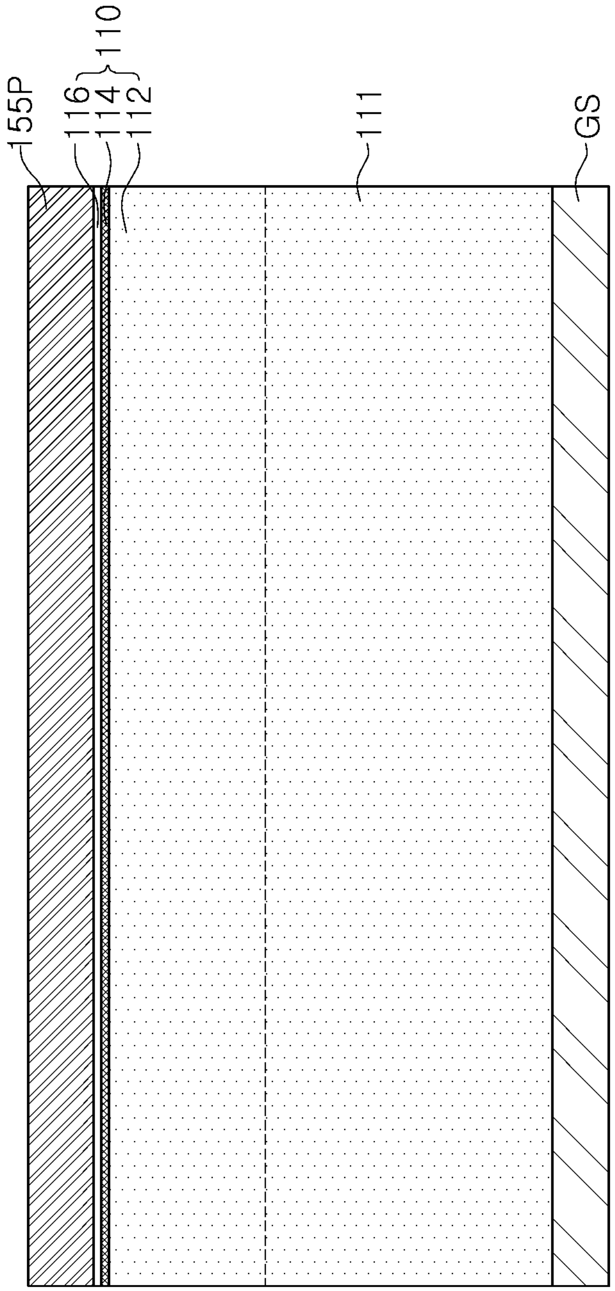
FIGS. 8A to 8Q are cross-sectional views for each main process in a method of manufacturing a display apparatus according to example embodiments.
Figure 8B:
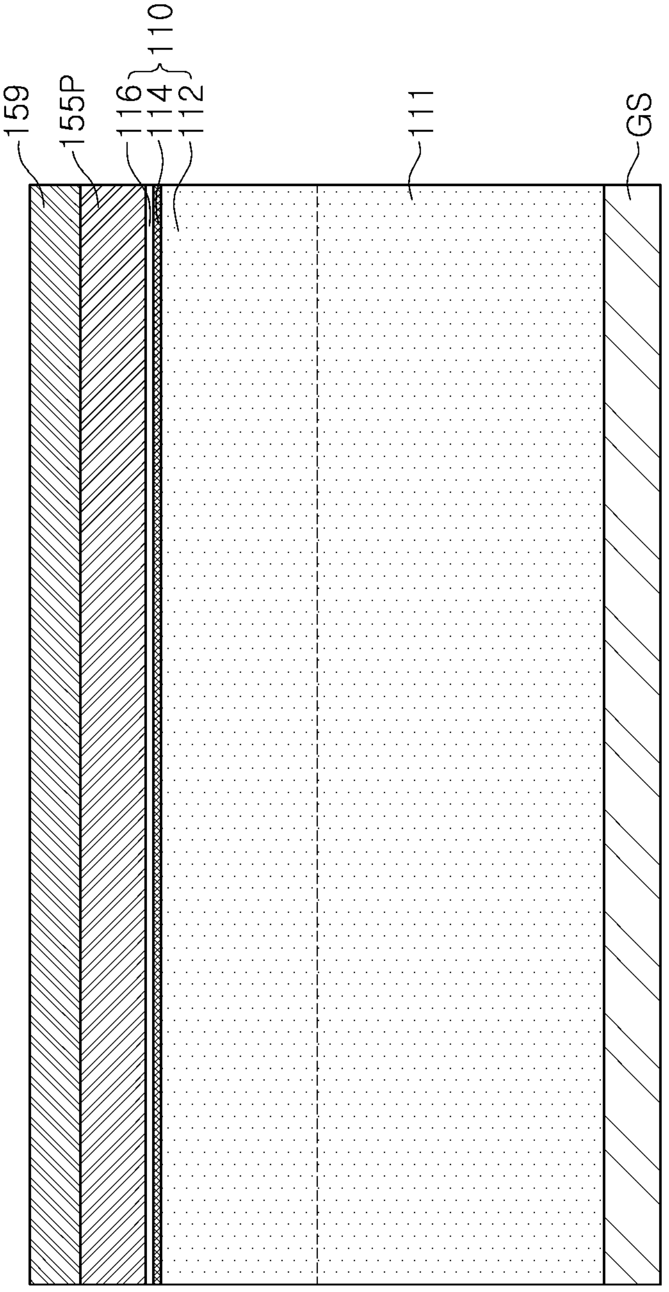
Figure 8C:
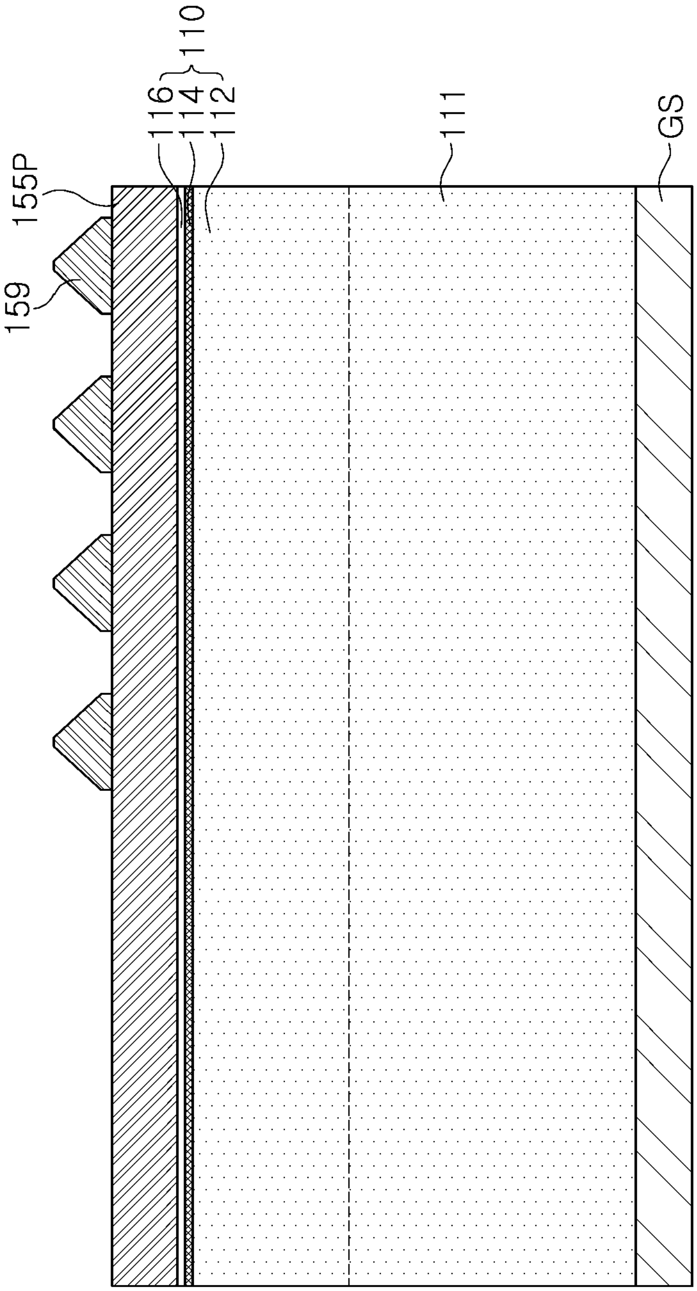
Figure 8D:
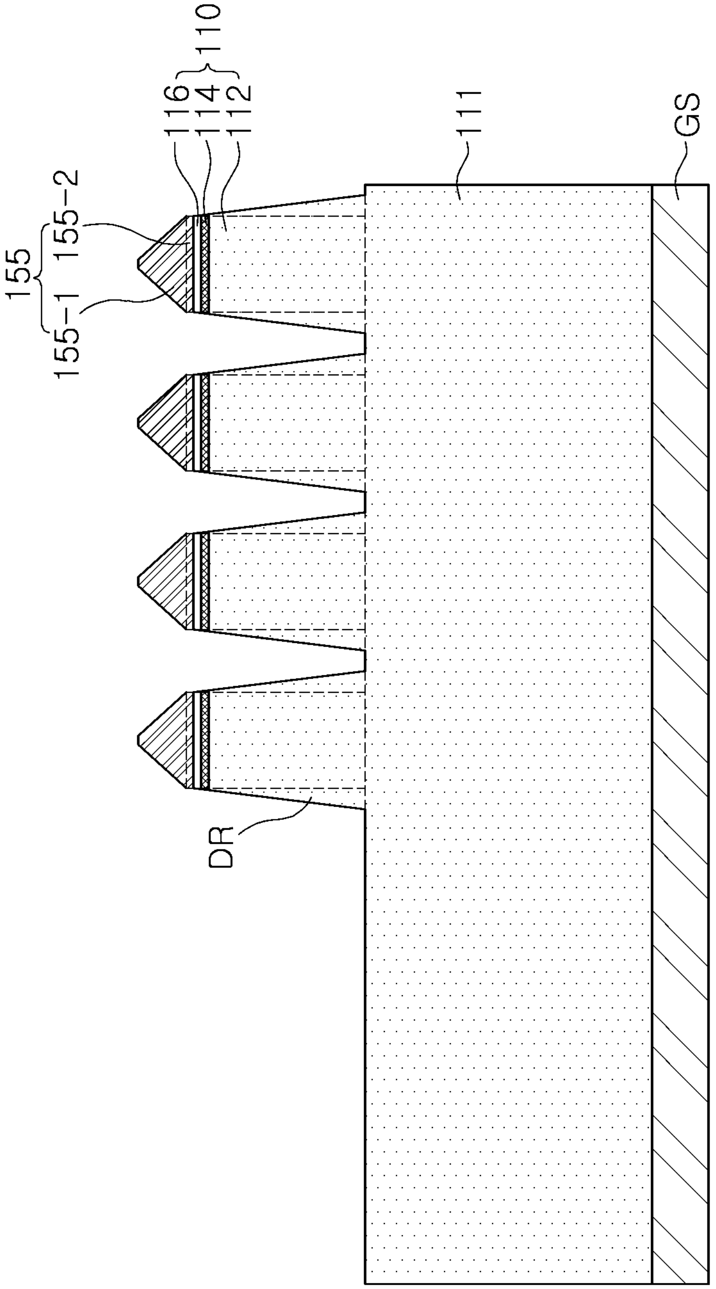
Figure 8E:
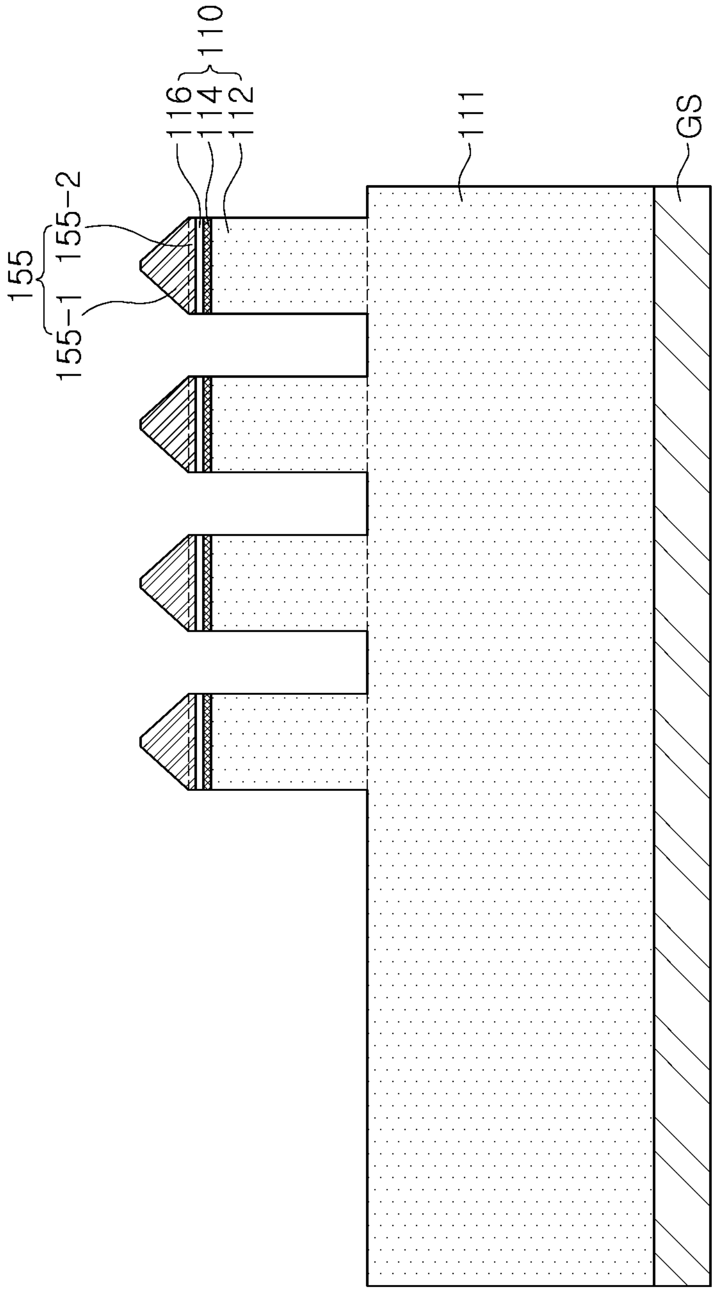
Figure 8F:
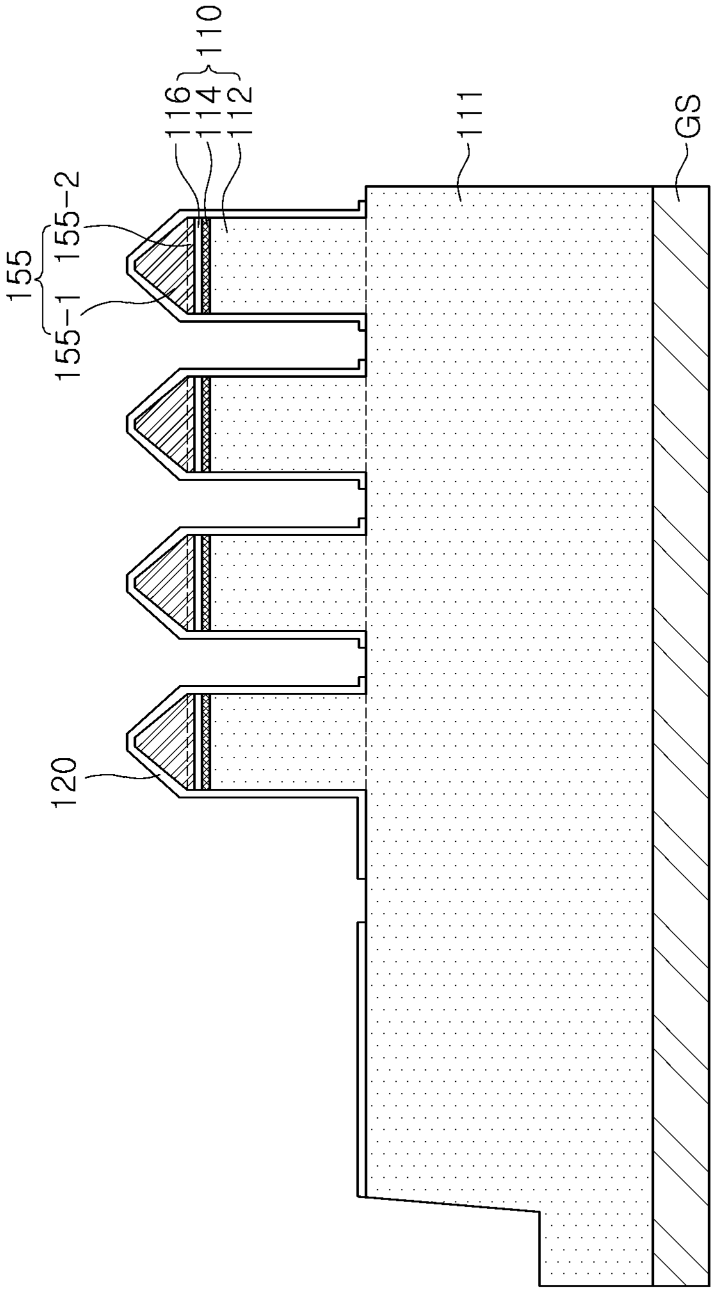
Figure 8G:
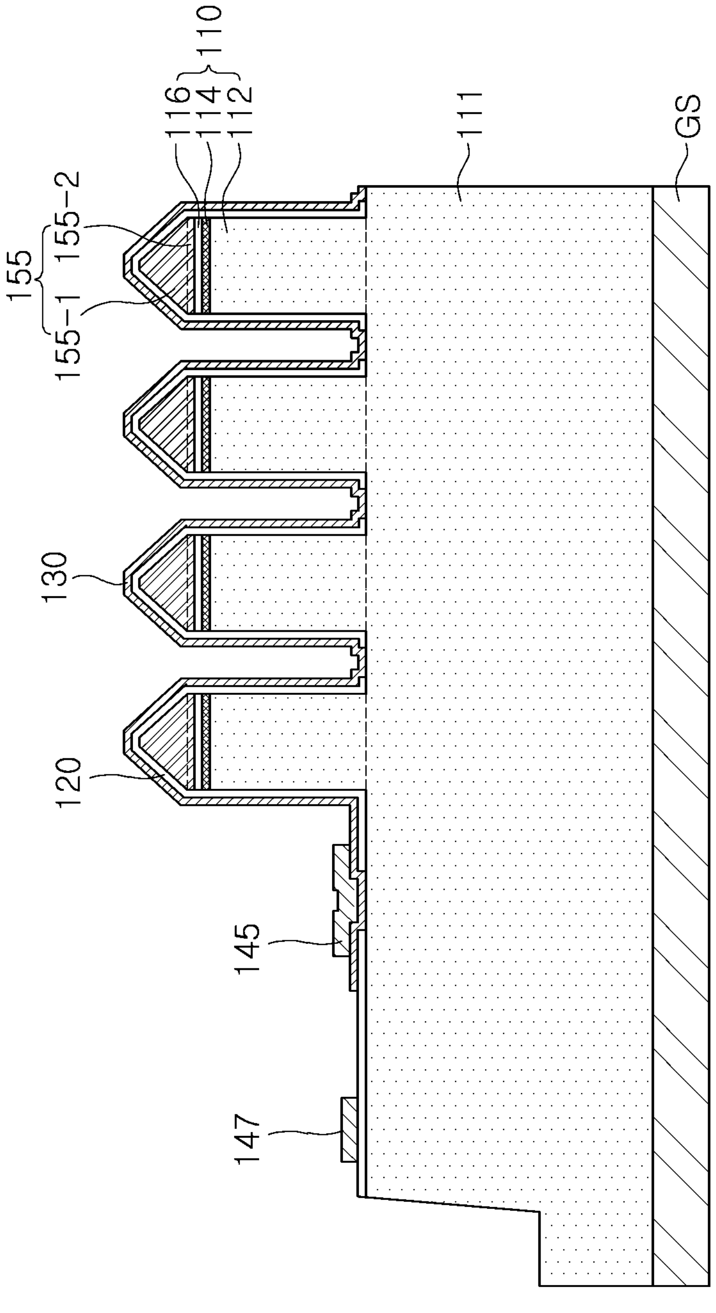
Figure 8H:
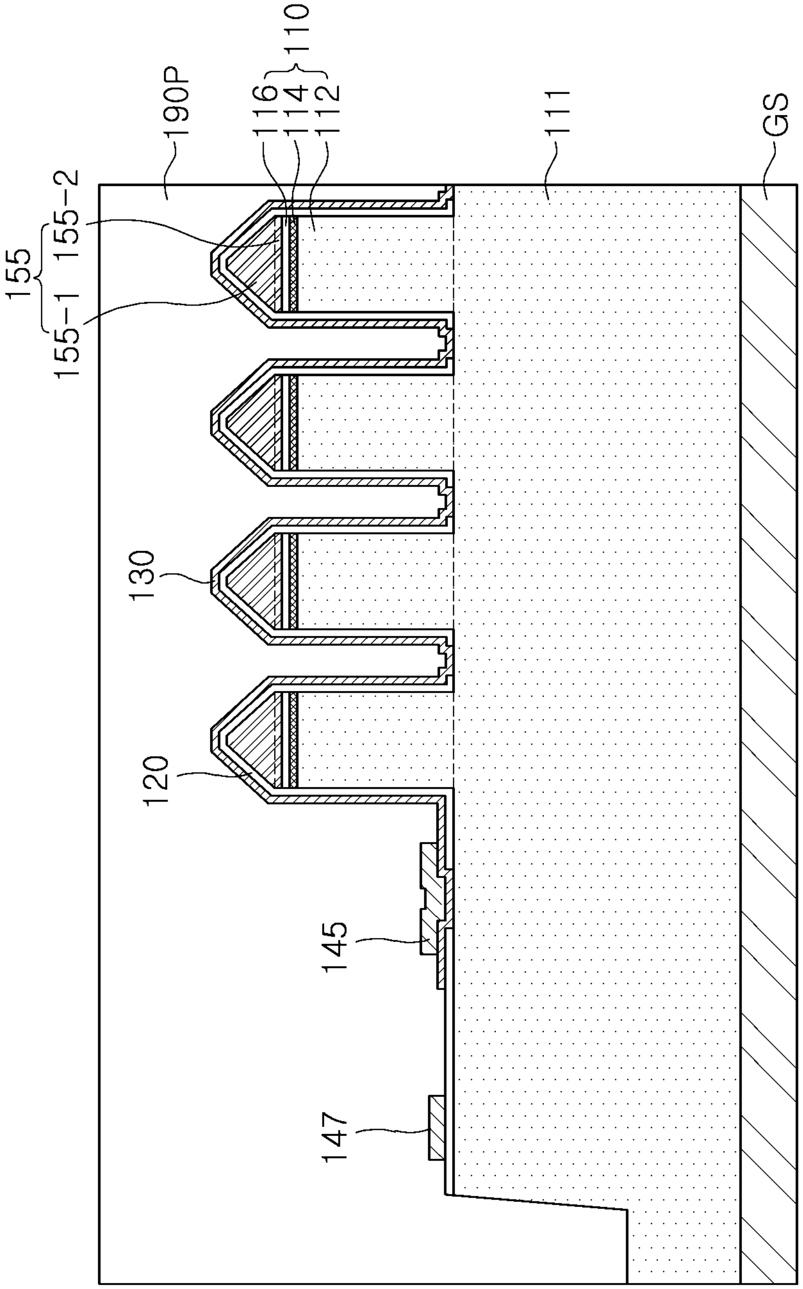
Figure 8I:
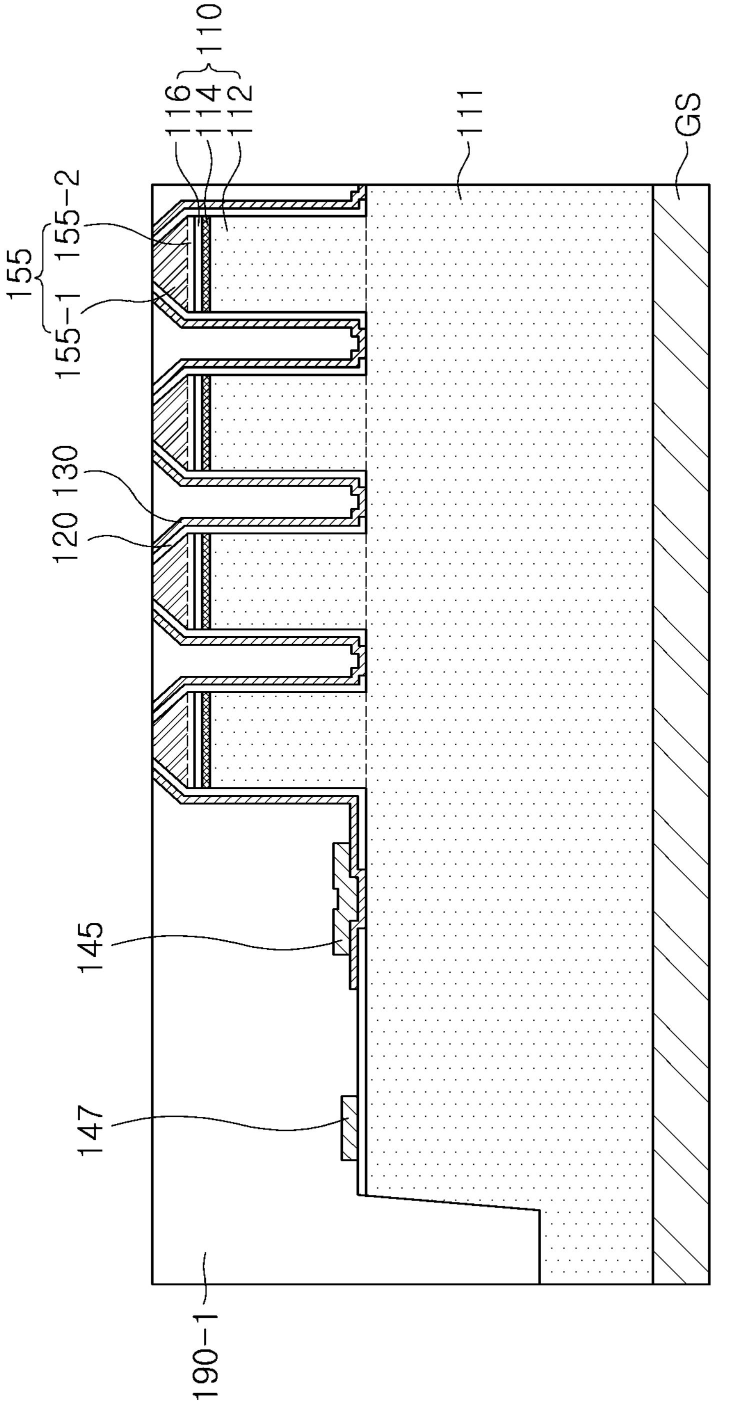
Figure 8J:
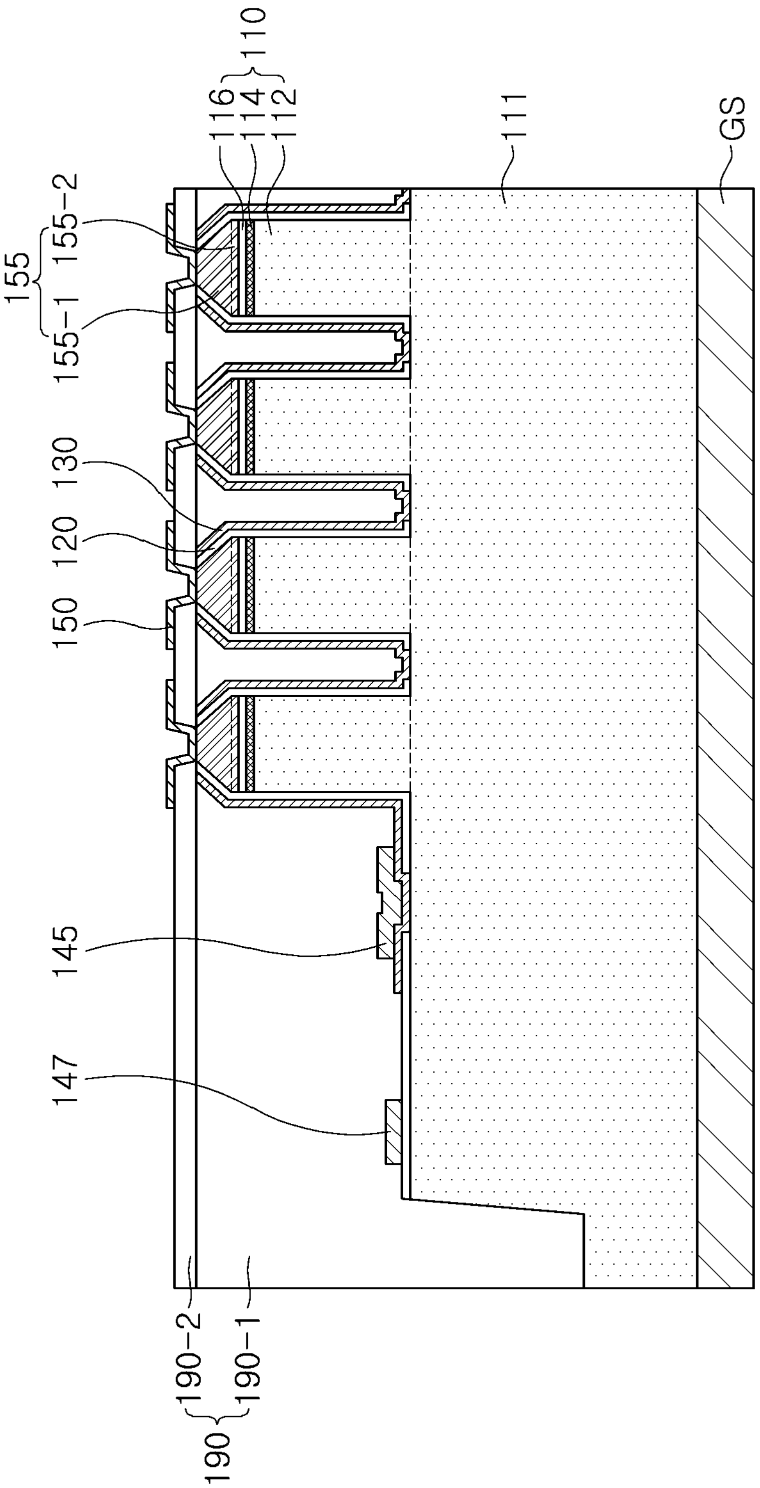
Figure 8K:
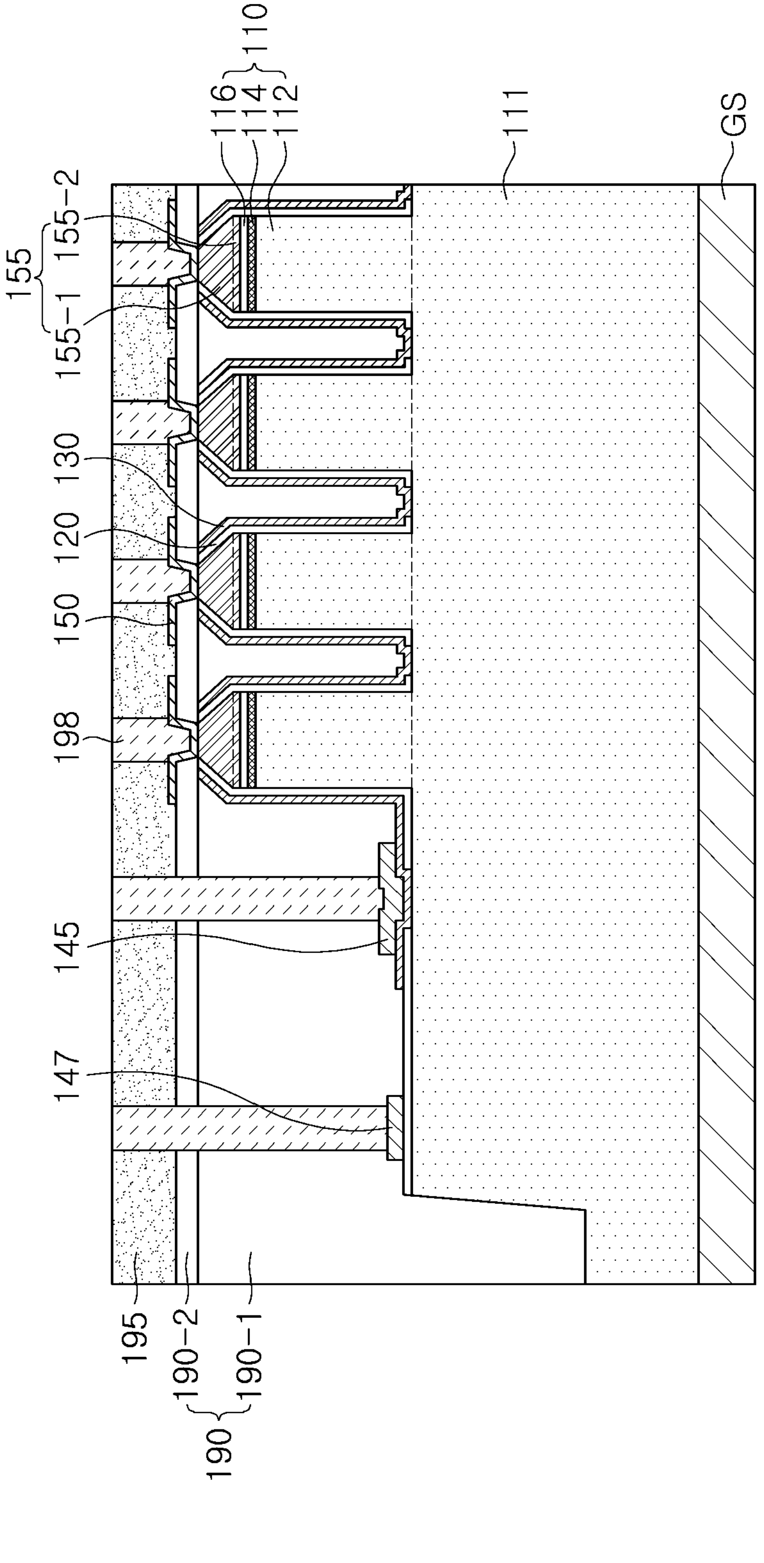
Figure 8L:
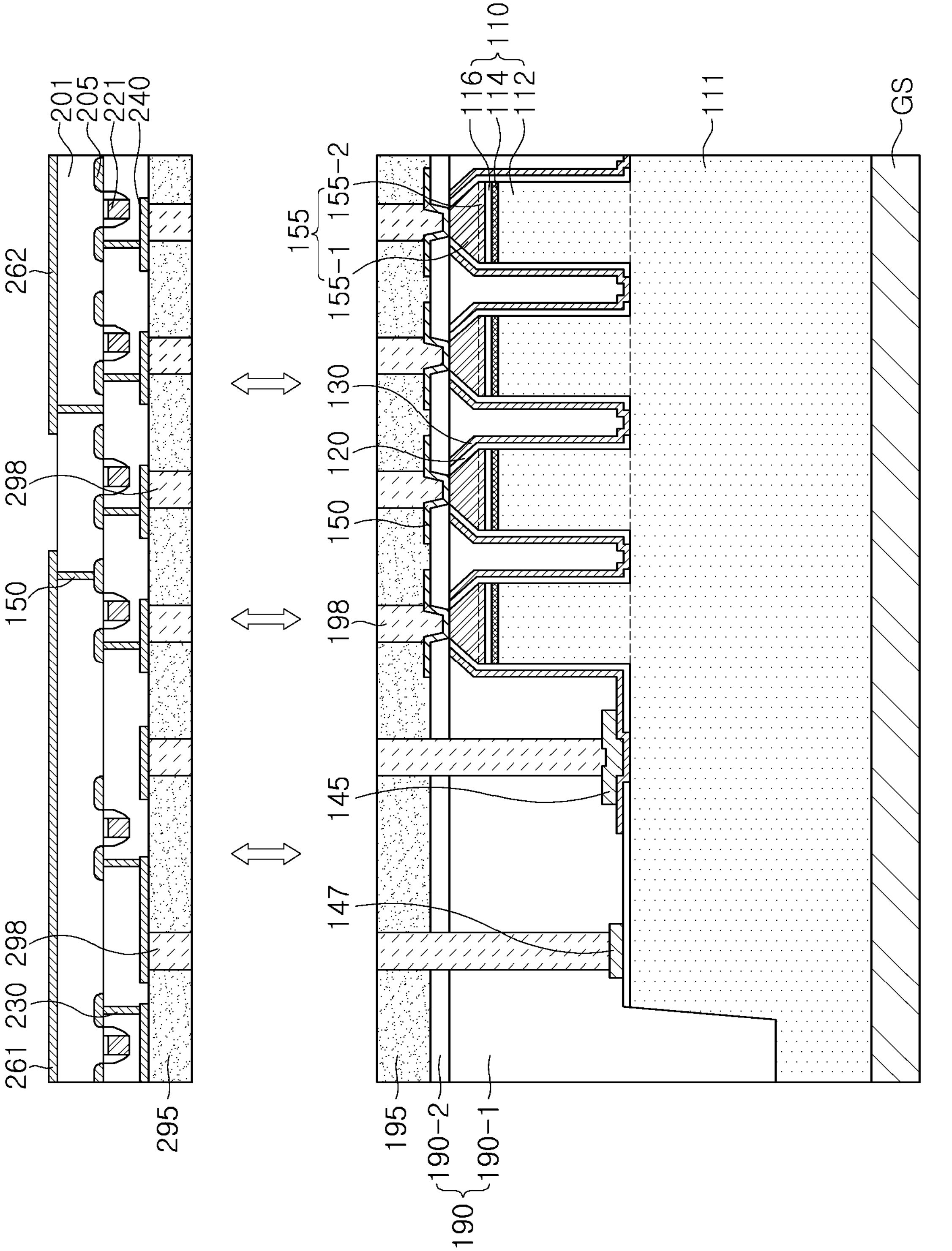
Figure 8M:
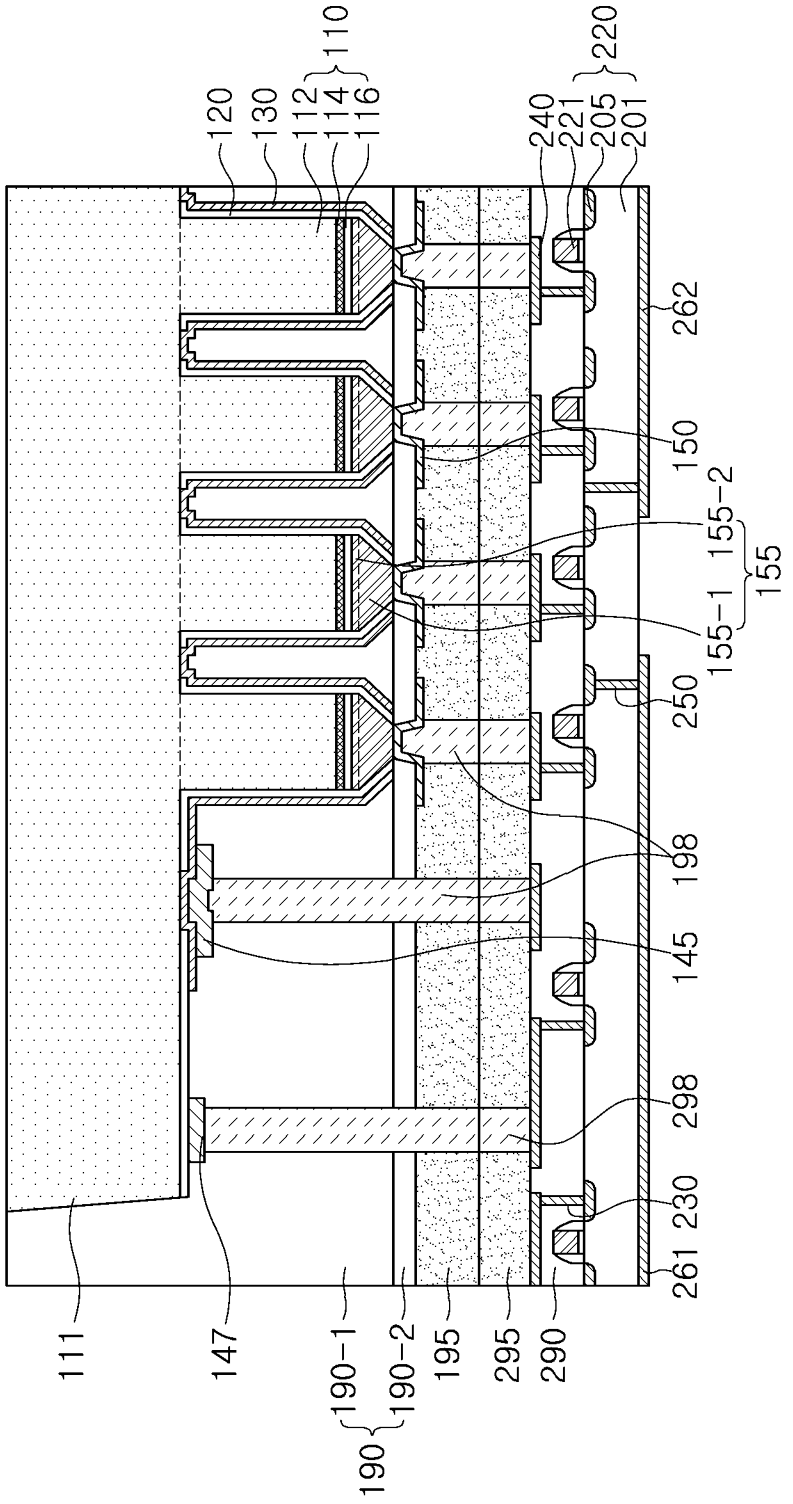
Figure 8N:
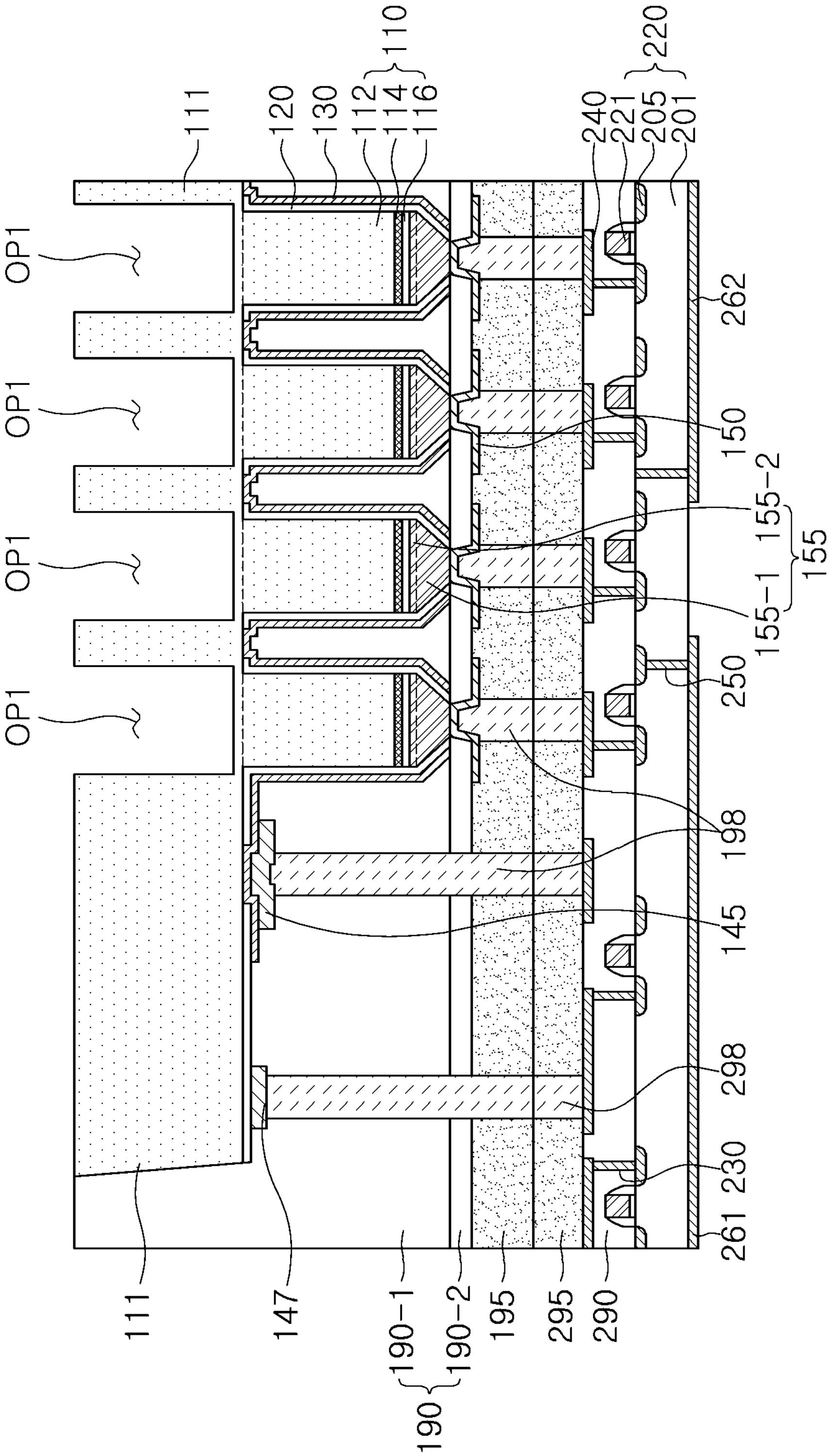
Figure 8O:
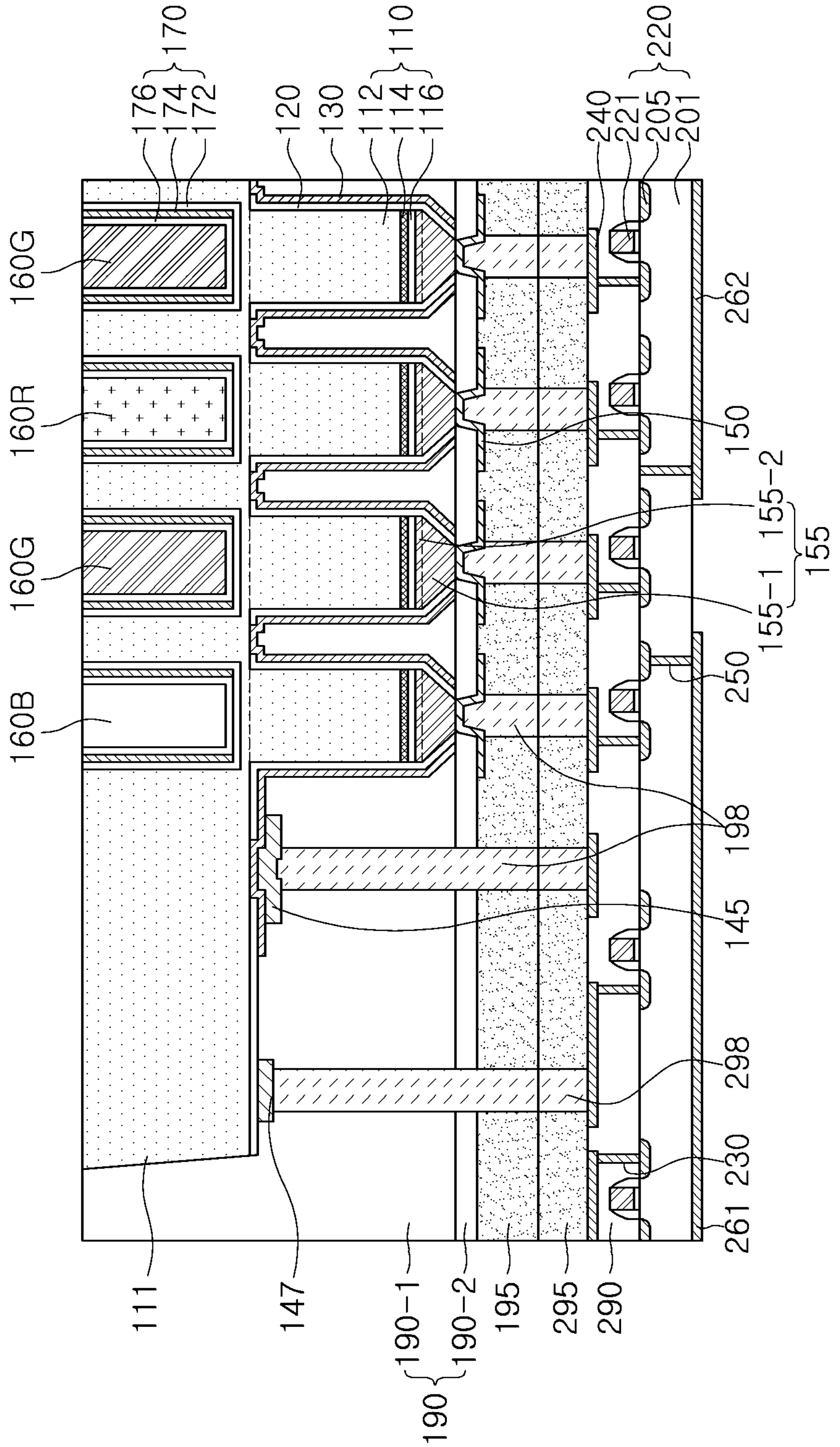
Figure 8P:
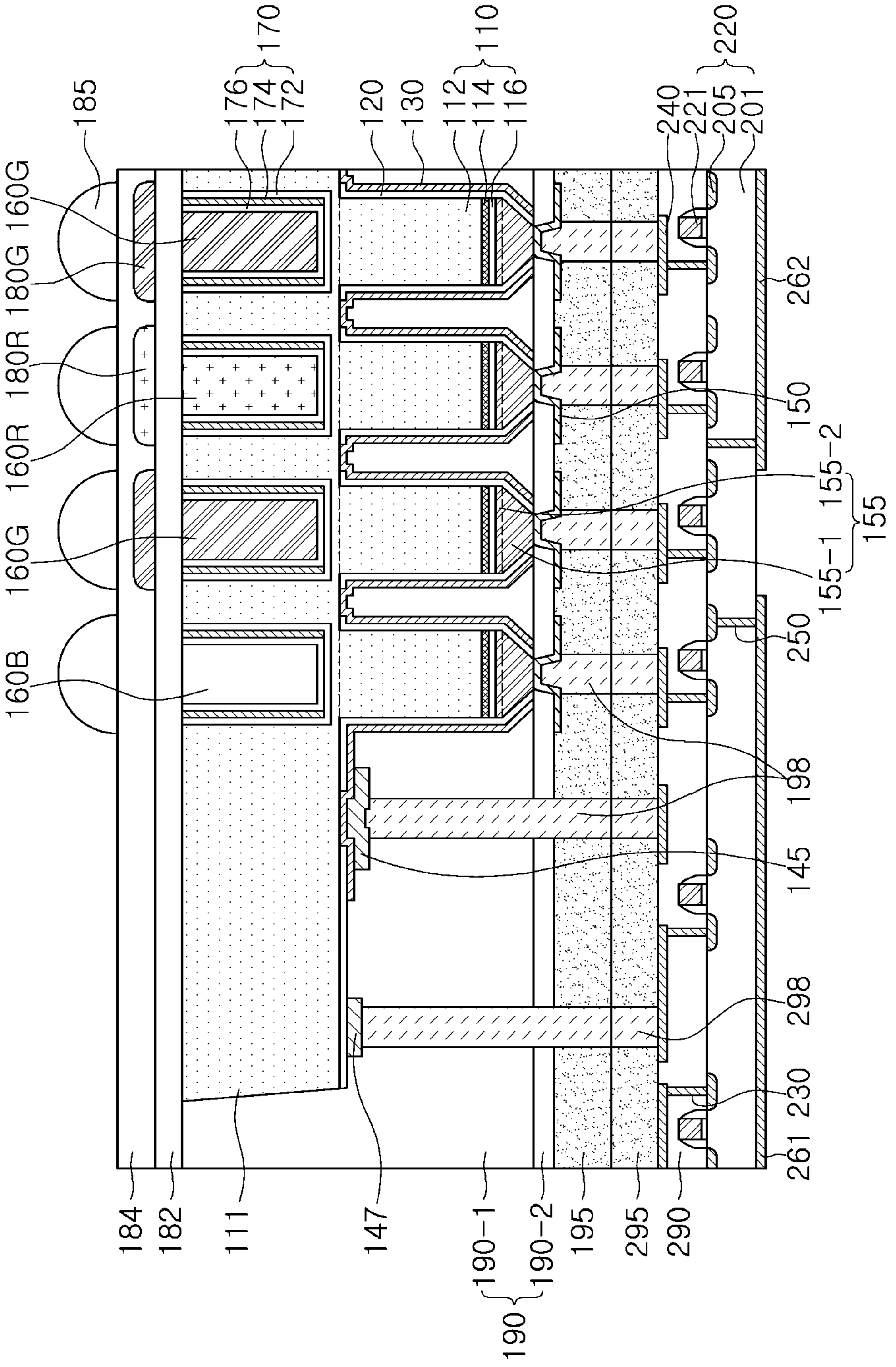
Figure 8Q:
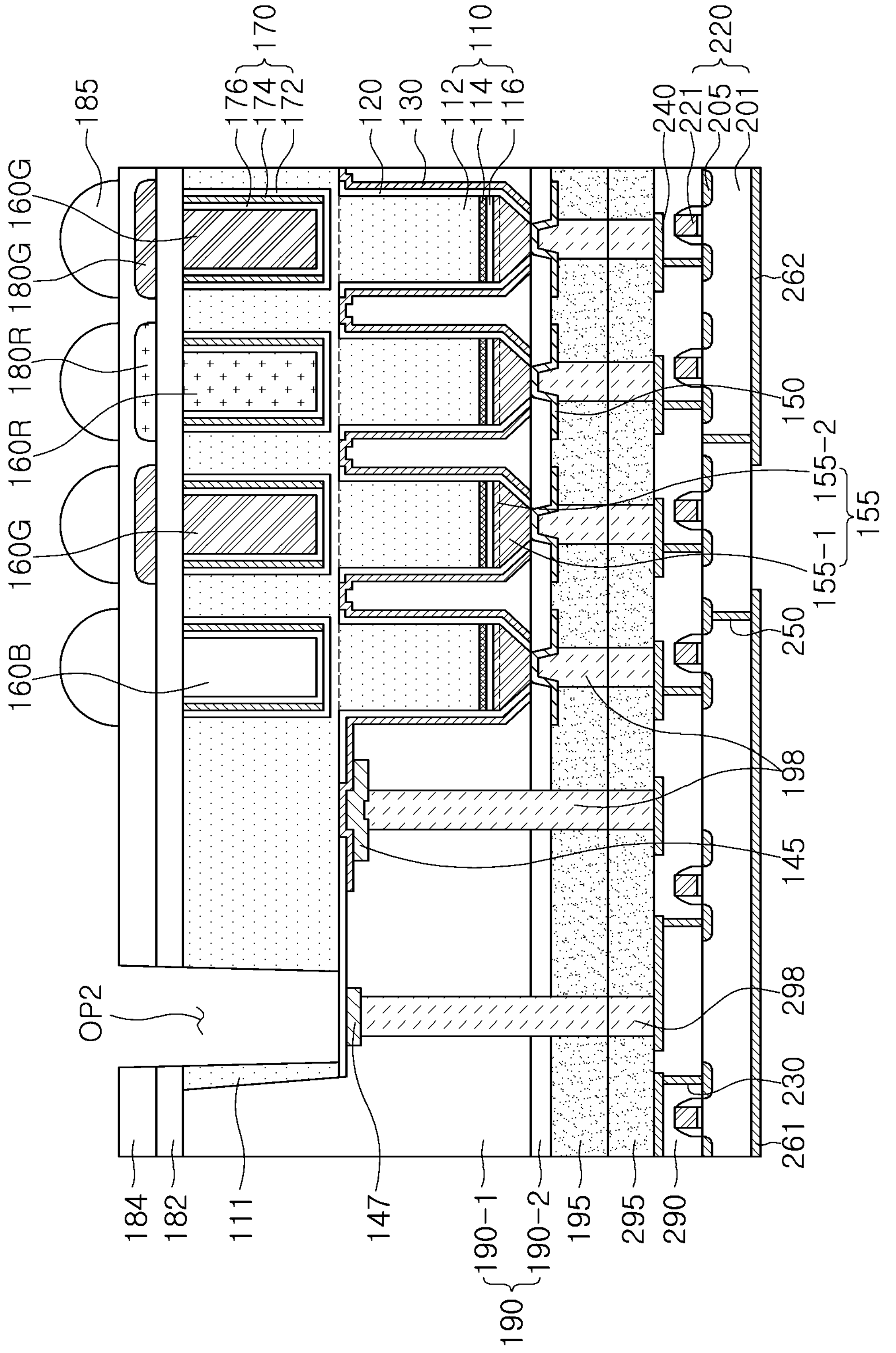

FIGS. 8A to 8Q are cross-sectional views for each main process in a method of manufacturing a display apparatus according to example embodiments. FIGS. 8A to 8Q exemplarily illustrate a method of manufacturing the display apparatus of the example embodiment of FIG. 3.

Referring to FIG. 8A, an upper semiconductor layer 111, a first conductivity-type semiconductor layer 112, an active layer 114, and a second conductivity-type semiconductor layer 116 may be sequentially formed on a growth substrate GS, and a transparent conductive layer 155P may be formed thereon.

The growth substrate GS may be meant to grow a nitride single crystal, and may include, for example, at least one of sapphire, Si, SiC, $MgAl_2O_4$, MgO, $LiAlO_2$, $LiGaO_2$, and GaN. In some example embodiments, in order to improve the crystallinity and light extraction efficiency of semiconductor layers, the growth substrate GS may have a convex-convex structure on at least a portion of an upper surface thereof. Convex-convex portions may also be formed in layers grown on the top.

An upper semiconductor layer 111, a first conductivity-type semiconductor layer 112, an active layer 114, and a second conductivity-type semiconductor layer 116 are formed, for example, by a metal organic chemical vapor deposition (MOCVD) process, a hydride vapor phase epitaxy (HVPE) process, or a molecular beam epitaxy (MBE) process. The first conductivity-type semiconductor layer 112 may be an N-type nitride semiconductor layer such as N-type GaN, and the second conductivity-type semiconductor layer 116 may be a P-type nitride semiconductor layer such as P-type GaN/P-type AlGaN. The active layer 114 may have a multi-quantum well structure such as InGaN/GaN. In some example embodiments, the upper semiconductor layer 111 may include a buffer layer. The buffer layer may be meant to alleviate lattice defects of the first conductivity-type semiconductor layer 112, and may include an undoped nitride semiconductor such as undoped GaN, undoped AlN, and undoped InGaN.

A transparent conductive layer 155P may be formed on an upper surface of the second conductivity-type semiconductor layer 116. For example, the transparent conductive layer 155P may include at least one of ITO, ZnO, ZITO, ZIO, GIO, ZTO, GTO, ZT, and AZO.

The transparent conductive layer 155P may be formed to have a height of 20% to 30% of a height H1 of the LED cells 110 formed in an operation of FIG. 8E. By making the transparent conductive layer 155P thicker than before, the first conductivity-type semiconductor layer 112, the active layer 114, and the second conductivity-type semiconductor layer 116 along with the transparent conductive layer 155P may be etched to allow the transparent electrode 155 to have a pyramid shape during a process of forming the LED cells 110 to have a desired height H1.

Referring to FIGS. 8B to 8E, a stacked structure of the first conductivity-type semiconductor layer 112, the active layer 114, the second conductivity-type semiconductor layer 116, and the transparent conductive layer 155P may be etched to form LED cells 110.

In the present operation, a portion of the stacked structure may be removed by means of a dry etching process and separated into first to third sub-pixels SP1, SP2 and SP3 (see FIG. 3). In the present operation, the stacked structure may be etched to have inclined side surfaces. Furthermore, some damaged regions DR (FIG. 8D) may be formed on the side surfaces of the LED cells 110 by means of the dry etching process.

Referring to FIG. 8B, a hard mask layer 159 may be formed on the transparent conductive layer 155P. A thickness of the hard mask layer 159 may be approximately 40 to 60% of a thickness of the transparent conductive layer 155P. By performing the operation described above, the time of forming a hard mask pattern in an operation of FIG. 8C may be minimized, and the hard mask pattern may be completely removed within the time of etching to a desired depth in an operation of FIG. 8D. The hard mask layer 159 may include at least one of $SiO_2$, SiN, $Al_2O_3$, HfO, $TiO_2$, ZrO, Al, Ti, Ni, and Cr.

Referring to FIG. 8C, the hard mask layer 159 may be etched to form a hard mask pattern 159. An inclined surface 155S is formed on an upper surface of the hard mask pattern 159.

Referring to FIG. 8D, a stacked structure of the first conductivity-type semiconductor layer 112, the active layer 114, the second conductivity-type semiconductor layer 116, and the transparent conductive layer 155P may be etched using the hard mask pattern 159, thereby forming LED cells 110. The stacked structure may be etched until the hard mask pattern 159 is completely removed so that an inclined upper surface shape of the hard mask pattern 159 is transferred to the transparent conductive layer 155P. An inclined surface 155S having an inclination of 40 degrees to 70 degrees may be formed on an upper surface of the transparent conductive layer 155P. However, an inclined upper surface shape is not formed up to the first conductive semiconductor layer 112 by excessively etching the stacked structure. Furthermore, a buffer portion 155-2 having a thickness of 5 nm to 100 nm, preferably 7 nm to 20 nm, having a substantially vertical side surface remains at a portion where the transparent conductive layer 155P is in contact with the first conductivity-type semiconductor layer 112, thereby reducing damage applied to the first conductivity-type semiconductor layer 112 through the transparent conductive layer 155P during dry etching. After etching, a height H2 of the transparent conductive layer 155P, that is, the transparent electrode 155, is 12% or more and 20% or less of a depth at which the first conductive semiconductor layer 112, the active layer 114, and the second conductive semiconductor layer 116 are etched. The height H2 of the transparent electrode 155 may be 0.32 times or more and 1.12 times or less of a width W2 of the transparent electrode 155.

When forming the LED cells 110, a hard mask pattern 159 may remain in the process of etching the first conductivity-type semiconductor layer 112, the active layer 114, the second conductivity-type semiconductor layer 116, and the transparent conductive layer 155P, and manufacturing time and costs may be reduced as compared to a conventional method of removing the remaining hard mask pattern 159 in a separate operation. Furthermore, alignment problems occurring at the time of creating an upper surface shape of the transparent conductive layer 155P in a separate operation may also be avoided.

Referring to FIG. 8E, damaged regions DR may be removed from the LED cells 110.

The damaged regions DR may be selectively removed by, for example, a wet etching process. During a wet etching process, process conditions may be controlled so that the stacked structure is etched with different selectivity ratios between crystal planes, thereby selectively removing only the damaged regions DR. As a result, an angle between an upper surface and side surfaces of the LED cells 110 may be vertical or close to a vertical angle, and non-radiative recombination due to the damaged regions DR may be reduced, thereby improving brightness. Each of the LED cells 110 may have a pillar shape in which a side surface thereof is 85 degrees to 95 degrees with respect to an upper surface thereof. The pillar shape can be a cylinder, square pillar, hexagonal pillar, or the like. A height H1 of the LED cells 110 may be 2.5 times or more and 6 times or less of a width W1 of the LED cells 110.

Referring to FIG. 8F, a passivation layer 120 may be formed and a portion of an upper semiconductor layer 111 may be removed from an edge region ISO.

The passivation layer 120 may be formed on an upper surface of the stacked structure with a uniform thickness and then, some regions thereof may be removed from regions in which the first reflective electrode 130 (see FIG. 3) will be formed. For example, the passivation layer 120 may include at least one of $SiO_2$, SiN, SiCN, SiOC, SiON, and SiOCN. The passivation layer 120 may be formed conformally, and thus may have a substantially uniform thickness, as illustrated.

In the edge region ISO, semiconductor layers forming the upper semiconductor layer 111 and the first conductivity-type semiconductor layer 112 may be removed by a predetermined depth. The edge region ISO may be a region cut in a subsequent process, which is meant to separate modules. Accordingly, in order to prevent cracks from occurring during a cutting or dicing process, a portion of the semiconductor layer may be removed in the present operation.

Referring to FIG. 8G, a first reflective electrode 130, a common electrode 145, and a first pad electrode 147 may be formed, as illustrated.

First, the first reflective electrode 130 may be formed conformally on a passivation layer 120 and a first conductivity-type semiconductor layer 112. Accordingly, the first reflective electrode 130 may have a substantially uniform thickness. The first reflective electrode 130 may be formed in a region where the pixels PX of FIG. 3 are arranged, and a connection region CR.

Next, the common electrode 145 and the first pad electrode 147 may be formed in the connection region CR and the connection pad PAD of FIG. 3, respectively. The common electrode 145 may be formed on the first reflective electrode 130 and the first pad electrode 147 may be formed on the passivation layer 120. The common electrode 145 and the first pad electrode 147 may be formed together through the same process. The first reflective electrode 130, the common electrode 145, and the first pad electrode 147 may include a conductive material, for example, a metal.

Referring to FIG. 8H, a preliminary wiring insulating layer 190P may be formed.

The preliminary wiring insulating layer 190P may be formed to cover all structures formed in the previous operations, by including the first reflective electrode 130. For example, the preliminary wiring insulating layer 190P may be a low dielectric material such as silicon oxide.

Referring to FIG. 8I, a wiring layer 190 may be formed by partially removing the preliminary wiring insulating layer 190P.

The preliminary wiring insulating layer 190P may be partially removed from the upper surface, using, for example, a planarization process such as a chemical mechanical polishing (CMP) process, or an etch-back process. During a process of removing the preliminary wiring insulating layer 190P, the first reflective electrode 130 and the passivation layer 120 may be removed from an upper end of the transparent electrode 155, thereby exposing the transparent electrode 155. At the same time, the transparent electrode 155 may also be partially removed. Upper ends of the first reflective electrode 130, the passivation layer 120, and the transparent electrode 155 may have the same level (i.e., are co-planar).

Referring to FIG. 8J, second reflective electrodes 150 connected to the transparent electrodes 155 may be formed.

First, a wire insulating layer 190 may be additionally formed, and contact holes penetrating through the wire insulating layer 190 and exposing the transparent electrodes 155 may be formed. By filling the contact holes with a conductive material, the contact holes may be filled and second reflective electrodes 150 extending to an upper surface of the wiring insulating layer 190 may be formed.

Referring to FIG. 8K, a second bonding insulating layer 195 may be formed on the second reflective electrodes 15, and second bonding electrodes 198 may be formed.

The second bonding insulating layer 195 may include the same material as that of the wiring insulating layer 190 or a material different from the wiring insulating layer 190. Furthermore, even when the second bonding insulating layer 195 includes a material different from that of the wiring insulating layer 190, a thickness of the second bonding insulating layer 195 in example embodiments may be variously changed in a range in which the second bonding insulating layer 195 forms an upper surface of the pixel array 100 (see FIG. 3).

The second bonding electrodes 198 may be formed by forming via holes penetrating through the second bonding insulating layer 195 and the wire insulating layer 190 and then filling the via holes with a conductive material. The second bonding electrodes 198 may be formed to be connected to the second reflective electrodes 150, the common electrode 145, and the first pad electrode 147.

Referring to FIG. 8L, a structure including LED cells 110 and a circuit board 200 may be bonded.

First, the circuit board 200 may be prepared through a separate process. The structure and the circuit board 200 may be bonded to each other on a wafer level by a wafer bonding method, for example, the hybrid bonding described above. First bonding electrodes 298 may be bonded to second bonding electrodes 198, and first bonding insulating layer 295 may be bonded to second bonding insulating layer 195. Accordingly, the structure including the LED cells 110 and the circuit board 200 may be connected without a separate adhesive layer.

Referring to FIG. 8M, a growth substrate GS (FIG. 8A) may be removed from the upper semiconductor layer 111, and the upper semiconductor layer 111 may be partially removed. In the following drawings, in order to facilitate understanding, the structure including the LED cells 110 is illustrated as being bonded in the form of a mirror image of the structure illustrated in FIG. 8L.

The growth substrate GS may be removed by various processes such as a laser lift-off process, a mechanical polishing or mechanical chemical polishing process, and an etching process.

For example, the upper semiconductor layer 111 may be partially removed to reduce a predetermined thickness using a polishing process such as CMP. For example, the upper semiconductor layer 111 may be removed by a level corresponding to a height of the upper surface of the wavelength converters 160R, 160G and 160B (see FIG. 3), and may be removed not to remain in the edge region ISO (see FIG. 3).

Referring to FIG. 8N, first openings OP1 may be formed in the upper semiconductor layer 111.

The first openings OP1 may be formed by removing the upper semiconductor layer 111 from a region in which the wavelength converters 160R, 160G and 160B (see FIG. 3) will be disposed. In the present embodiment, the first openings OP1 may be formed so that the first conductivity-type semiconductor layer 112 is not completely separated between the LED cells 110 in the present operation. Accordingly, the first conductivity-type semiconductor layer 112 may be continuously disposed between an upper surface of the first reflective electrode 130 and bottom surfaces of the first openings OP1.

Referring to FIG. 8O, partition reflective layers 170 and wavelength converters 160R, 160G and 160B may be formed in the first openings OP1.

Partition reflective layers 170 may be formed by forming a first partition insulating layer 172 and a partition metal layer 174, removing the partition metal layer 174 from bottom surfaces of the first openings OP1, and then forming a second partition insulating layer 176.

On the partition reflective layer 170, a transparent resin may be formed to form a third wavelength converter 160B, and a transparent resin mixed with a wavelength conversion material may be formed to form first and second wavelength converters 160R and 160G. The wavelength conversion material may convert blue light into red light and green light in each of the first and second wavelength converters 160R and 160G. The transparent resin may include, for example, a transparent resin such as silicone resin or an epoxy resin. Alternatively, in some example embodiments, the wavelength converters 160R, 160G and 160B may be formed of silicon oxide such as $SiO_2$ instead of the transparent resin.

Referring to FIG. 8P, color filters 180R and 180G and microlenses 185 may be formed on the wavelength converters 160R, 160G and 160B.

First, a sealing layer 182 may be formed on the wavelength converters 160R, 160G and 160B to protect the wavelength converters 160R, 160G and 160B from moisture and oxygen. The color filters 180R and 180G may be formed on the first and second wavelength converters 160R and 160G, respectively. In some example embodiments, the color filters 180R and 180G may also be formed on the third wavelength converter 160B.

Next, a planarization layer 184 covering the color filters 180R and 180G may be formed, and the microlenses 185 may be formed.

Referring to FIG. 8Q, an upper semiconductor layer 111 and a first conductivity-type semiconductor layer 112 may be removed from a first pad electrode 147, thus forming a second opening OP2.

The second opening OP2 may be formed to expose a passivation layer 120 on the first pad electrode 147 in the connection pad PAD of FIG. 3. Next, referring to FIG. 3, after partially removing the passivation layer 120 exposed through the second opening OP2, a second pad electrode 199 may be formed, and adjacent modules may be subject to a dicing process in the edge area ISO, thereby manufacturing the display apparatus 10.

Figure 9:
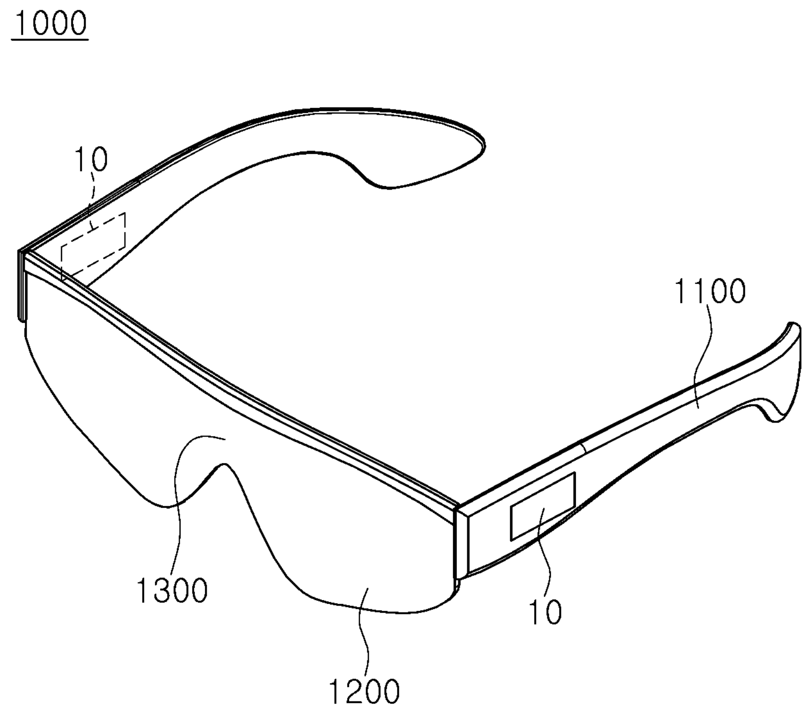
FIG. 9 is a conceptual diagram illustrating an electronic device including a display apparatus according to example embodiments.

FIG. 9 is a conceptual diagram of an electronic device including a display apparatus according to example embodiments.

Referring to FIG. 9, an electronic device 1000 may be a glasses-type display, which is a wearable device. The electronic device 1000 may include a pair of templates 1100, a pair of optical coupling lenses 1200, and a bridge 1300. The electronic device 1000 may further include a display apparatus 10 including an image generator.

The electronic device 1000 may be a head mounted-shaped device, a glasses-type device, or a goggle virtual reality (VR) device, an augmented reality (AR) device, or a mixed reality (MR) device, which may provide virtual reality or provide a virtual image and an external real landscape together.

The templates 1100 may extend in one direction. The templates 1100 may be spaced apart from each other and extend parallel to each other. The templates 1100 may be folded towards the bridge 1300. The bridge 1300 may be provided between the optical coupling lenses 1200 to connect the optical coupling lenses 1200 to each other. The light coupling lenses 1200 may include a light guide plate. The display apparatus 10 may be disposed on the templates 1100, respectively, and may generate images in the optical coupling lenses 1200. The display apparatus 10 may be a display apparatus according to embodiments described above with reference to FIGS. 1 to 8.

The present disclosure is not limited to the above-described embodiments and the accompanying drawings but is defined by the appended claims. Therefore, those of ordinary skill in the art may make various replacements, modifications, or changes without departing from the scope of the present disclosure defined by the appended claims, and these replacements, modifications, or changes should be construed as being included in the scope of the present disclosure.

What is claimed is:

1. A display apparatus comprising:

a circuit board comprising driving circuits and first bonding electrodes; and a pixel array on the circuit board, the pixel array comprising LED cells forming a plurality of pixels, and second bonding electrodes bonded to the first bonding electrodes, wherein each of the LED cells has a width of 100 μm or less and comprises a first conductivity-type semiconductor layer, an active layer, and a second conductivity-type semiconductor layer sequentially stacked, and wherein the pixel array comprises:

a wavelength converter on an upper surface of each of the LED cells;

an upper semiconductor layer on the LED cells and having a partition structure extending around a side surface of each wavelength converter and that separates the wavelength converters from each other;

a transparent electrode on a lower surface of each of the LED cells, wherein each transparent electrode comprises a cone or pyramid-shaped inclined portion, wherein an inclination of a surface of the inclined portion is 40° to 70°;

a passivation layer covering a side surface of each of the LED cells;

a first reflective electrode on the side surface of each of the LED cells and spaced apart from each of the LED cells by the passivation layer, wherein the first reflective electrode extends to a region between the LED cells, and is connected to the first conductivity-type semiconductor layer in the region between the LED cells;

a second reflective electrode on the lower surface of each of the LED cells and connected to the second conductivity-type semiconductor layer of each of the LED cells;

a common electrode on at least one side of the LED cells and connected to the first reflective electrode; and a pad electrode external to the common electrode and electrically connected to the driving circuits.

2. The display apparatus of claim 1, wherein the inclined portion of each of the transparent electrodes comprises a top end having a flat surface.

3. The display apparatus of claim 1, wherein in plan view, an area ratio of the surface of the inclined portion of the transparent electrode to a total planar area of the transparent electrode is 50% or more.

4. The display apparatus of claim 1, wherein the upper semiconductor layer comprises a first region in contact with the first conductivity-type semiconductor layer, wherein the first region is doped with the same polarity as that of the first conductivity-type semiconductor layer, and wherein the first region is doped with a concentration higher than an average impurity concentration of the first conductivity-type semiconductor layer.

5. The display apparatus of claim 4, wherein the first region overlaps the wavelength converter on the upper surface of each of the LED cells, and is connected between the LED cells in a single layer.

6. The display apparatus of claim 1, wherein a height of each of the LED cells is 2.5 times or more and 6 times or less of the width thereof, and wherein the width of each of the LED cells is 100 nm or more and 10 μm or less.

7. The display apparatus of claim 1, wherein the width of each of the LED cells is 500 nm or more and 1500 nm or less, and wherein a height of each of the transparent electrodes is 0.32 times or more and 1.12 times or less of a width of the transparent electrodes.

8. The display apparatus of claim 1, wherein a height of each of the transparent electrodes is 12% or more and 20% or less of a height of each of the LED cells.

9. The display apparatus of claim 1, wherein each of the transparent electrodes further comprises a buffer portion having a pillar shape between the inclined portion and a respective one of the LED cells.

10. The display apparatus of claim 9, wherein a thickness of the buffer portion is 5 nm or more and 100 nm or less.

11. The display apparatus of claim 10, wherein a thickness of the buffer portion is 7 nm or more and 20 nm or less.

12. The display apparatus of claim 1, wherein the pixel array further comprises a wiring insulating layer that fills a space between the LED cells and covers the inclined portion of each transparent electrode.

13. The display apparatus of claim 1, wherein the passivation layer and the first reflective electrode extend onto the surface of the inclined portion of each of the transparent electrodes, and wherein the second reflective electrode is connected to the transparent electrode through an opening formed in a lower end of the passivation layer.

14. The display apparatus of claim 13, wherein the lower end of the passivation layer, a lower end of the first reflective electrode, and a lower end of the transparent electrode are co-planar.

15. The display apparatus of claim 14, wherein the pixel array further comprises a wiring insulating layer that fills a space between the LED cells, wherein the wiring insulating layer comprises a first layer and a second layer, and wherein a height of an interface between the first layer and the second layer is the same as a height of the lower end of the passivation layer.

16. The display apparatus of claim 1, wherein, for each LED cell, an angle between the lower surface and the side surface thereof ranges from about 85 degrees to about 95 degrees.

17. The display apparatus of claim 1, wherein the circuit board further comprises a first bonding insulating layer extending around the first bonding electrodes and forming an upper surface of the circuit board, and wherein the pixel array further comprises a second bonding insulating layer extending around the second bonding electrodes and forming a lower surface of the pixel array, and wherein the second bonding insulating layer is bonded to the first bonding insulating layer.

18. The display apparatus of claim 1, wherein among the second bonding electrodes, bonding electrodes connected to the second reflective electrodes have a first height, and among the second bonding electrodes, bonding electrodes connected to the common electrode have a second height greater than the first height.

19. A display apparatus comprising:

a circuit board comprising driving circuits; and a pixel array on the circuit board, the pixel array comprising a plurality of pixels, wherein the pixel array comprises:

a plurality of LED cells, each of the plurality of LED cells having a pillar shape and comprising a first conductivity-type semiconductor layer, an active layer, and a second conductivity-type semiconductor layer that are sequentially stacked, wherein a width of each of the plurality of LED cells is 100 μm or less, and wherein a height of each of the plurality of LED cells is greater than the width;

a transparent electrode on a lower surface of each of the plurality of LED cells and comprising a cone or pyramid-shaped inclined portion;

a passivation layer on a side surface of each of the plurality of LED cells and extending to a side surface of the inclined portion of the transparent electrode;

a first electrode connected to the first conductivity-type semiconductor layer in each of the plurality of LED cells; and a second electrode on the lower surface of each of the plurality of LED cells and connected to the second conductivity-type semiconductor layer in each of the plurality of LED cells.

20. A display apparatus comprising:

a circuit board; and a pixel array on the circuit board, wherein the pixel array comprises:

a plurality of LED cells, each of the plurality of LED cells having a pillar shape and comprising a first conductivity-type semiconductor layer, an active layer, and a second conductivity-type semiconductor layer sequentially stacked, wherein a height of each of the plurality of LED cells is greater than a width of each of the plurality of LED cells;

a plurality of transparent electrodes, wherein each transparent electrode covers an entire lower surface of a respective one of the plurality of LED cells, and wherein each of the plurality of transparent electrodes comprises a cone or pyramid-shaped inclined portion;

a passivation layer on a side surface of each of the plurality of LED cells and extending to a surface of the inclined portion of each of the plurality of transparent electrodes;

a first electrode connected to the first conductivity-type semiconductor layer of each of the plurality of LED cells; and a second electrode connected to the second conductivity-type semiconductor layer of each of the plurality of LED cells through a respective one of the plurality of transparent electrodes.

* * * * *